(12) United States Patent
Krilic

(10) Patent No.: US 9,368,193 B2
(45) Date of Patent: Jun. 14, 2016

(54) METHODS FOR REDUCING POWER DISSIPATION IN DROWSY CACHES AND FOR RETAINING DATA IN CACHE-MEMORY SLEEP MODE

(71) Applicant: Goran Krilic, Zagreb (HR)

(72) Inventor: Goran Krilic, Zagreb (HR)

(*) Notice: Subject to any disclaimer, the term of this patent is extended or adjusted under 35 U.S.C. 154(b) by 218 days.

(21) Appl. No.: 13/856,425

(22) Filed: Apr. 3, 2013

(65) Prior Publication Data

US 2013/0286718 A1    Oct. 31, 2013

(51) Int. Cl.
*G11C 11/412*    (2006.01)
*G11C 5/14*    (2006.01)

(52) U.S. Cl.
CPC .............. *G11C 11/412* (2013.01); *G11C 5/148* (2013.01)

(58) Field of Classification Search
CPC ........................................................ H04L 27/11
USPC ...................... 365/154, 156, 230.05; 257/903
See application file for complete search history.

(56) References Cited

U.S. PATENT DOCUMENTS

| | | | | |
|---|---|---|---|---|
| 5,726,562 A | * | 3/1998 | Mizuno | 323/312 |
| 2006/0176083 A1 | * | 8/2006 | Krilic | 327/51 |
| 2010/0034013 A1 | * | 2/2010 | Krilic | G11C 11/405 365/156 |
| 2012/0182792 A1 | * | 7/2012 | Cheng | G11C 11/413 365/154 |

\* cited by examiner

*Primary Examiner* — Alexander Sofocleous
*Assistant Examiner* — Alfredo Bermudez Lozada
(74) *Attorney, Agent, or Firm* — Shalini Venkatesh

(57) ABSTRACT

A method for refreshing static random access memory comprises providing at least one six-transistor static random access memory cell disposed on a substrate and providing a light source emitting light. The six-transistor static random access memory cell comprises two storage nodes, two pass transistors, two load transistors, and two driver transistors, the drain diffusion regions of the load transistors forming pn-junctions with the substrate. A portion of the light emitted by the light source is absorbed and converted to minority carriers in the substrate, The minority carriers diffuse through the substrate, and a portion of the minority carriers reach the pn-junctions and cause the pn-junctions to generate electrical current. The electrical current generated charges the storage nodes.

2 Claims, 25 Drawing Sheets

METHODS FOR REDUCING POWER DISSIPATION IN DROWSY CACHES AND FOR RETAINING DATA IN CACHE-MEMORY SLEEP MODE

TECHNICAL FIELD OF THE INVENTION

This invention is related to methods for refreshing of SRAM memory chips, and more particularly to optical refreshing of 6-transistor SRAM memory chips used in cache memories in microprocessors, systems-on-chip, and memory chips.

BACKGROUND

Embedded SRAM memory consumes large area on today's digital electronics chips. Specifically, in microprocessors SRAM caches consume 50% of the chip area, while in Systems on Chip (SOC) consume as much as 90% of the chip area. Volatile memories require refreshing to keep information intact and this refreshing requires electrical energy which is drawn from the power supply or a battery. In mobile devices, battery life is a primary customer concern and hence the reduction of the energy required to refresh and maintain the information in SRAMs is paramount importance to many a component manufacturer. The source of information loss in a SRAM memory cell is sub-threshold and gate leakage current, which effectively drains the gate charge. Gate charge quantity represents the digital information stored in the memory. Charge leakage from the storage nodes results in loss of information. Refreshing of memory cells refers to a method of restoring the charge or significantly reducing the leakage of charge from the memory nodes.

However, as CMOS technology nodes progress, not only the number of transistors in memory chips increases, but due to shrinking transistors dimensions, leakage current per transistor increases. Clearly, the power to refresh and maintain transistor increases faster than the number of transistors on a chip. For example, each new technology node, for example, going from 90 nm to 65 nm node, increases the standby leakage seven times.

One approach to the reduction of power lost to maintaining volatile memory is dynamical suppression of leakage. In this approach, parts of the memory that are not used or idle are subjected to lower supply voltage or the voltage/ground is gated off. In lower voltage standby state, the memory cells must still maintain the information. By reducing the supply voltage, the overall power to maintain memory is reduced. This approach and analysis are shown in a number of publicly available documents including J. Wang and B. H. Calhoun titled "Standby Supply Voltage Minimization for Reliable Nanoscale SRAMs" appearing in Solid State Circuits Technologies, ed. J. W. Swart, ISBN 978-953-307-045-2, p. 462. This chapter and references within are included in this application as a reference. Other publicly available references of these methods are published in *On-Chip PT Sensor Circuits for Minimum Data Retention Voltage*, book by Kyung Ki Kim in Springer-Verlag, Embedded and Multimedia Computing Technology and Service, Lecture Notes in Electrical Engineering Volume 181, 2012, pp 559-566.

The leakage-current components for a 6T SRAM cell are all supply voltage dependent and reduce with reducing supply voltage. FIG. 1 shows a circuit diagram of 6-transistor SRAM cell (PRIOR ART). The dominant components of leakage in memory cells are sub-threshold and gate leakage currents. Decreasing supply voltage (VDD) from 1 V to 0.300 V will decrease the cell leakage over 90%. Ideally, one would like to reduce the supply voltage to zero to completely eliminate the power dissipation during standby, but this not possible using this method because when the supply voltage reduces, the charge node voltage is also reduced proportionally. In the reduced supply voltage case, all transistors are off. However, the data (charge on the storage nodes) is preserved because sub-threshold leakage of PMOS load transistor is in equilibrium to NMOS pass and NMOS driver transistor leakage currents. The supply voltage has a lower limit below which the memory cell becomes unstable and is likely to lose charge from the memory nodes. This lower limit is commonly referred to as the Data Retention Voltage (DRV). Furthermore, the components of leakage current in the memory cell have different temperature dependencies. FIG. 9 shows the temperature dependence and the relative magnitude of leakage currents in a typical SRAM memory cell. Due to the difference in temperature dependence of leakage currents, a certain voltage margin is required and generally added on top of DRV. The DRV margin is temperature dependent. In temperature range from 25° C. to 125° C., the DRV margin, referred to as high-temperature DRV margin, is as low as 10 mV, because both PMOS load and NMOS driver transistor sub-threshold leakage increase equally. However, below room temperature (<25° C.), the DRV margin, referred to as the low-temperature margin, is significantly larger (~100 mV). This higher margin is needed to maintain data integrity. The reason for this is that in the low temperature regime, the gate leakage, which is temperature independent, dominates the leakage. Sub-threshold leakage of the PMOS load transistor cannot compensate the gate leakage unless there is a larger supply voltage margin. This large margin can be realized by either lowering the threshold voltage of the PMOS load transistors or by increasing the DRV. In either case, the power dissipation of the SRAM is increased and will drain a battery of a mobile device. Approximately 60% larger dissipation power would be experienced when the margin is increased from 10 mV to 100 mV for DRV=150 mV.

Another example of a problem encountered in the placing SRAM memory to standby or sleep mode occurs in recently introduced gated-VDD or gated-GND approaches to reducing power dissipation in SRAMs. In these approaches, sections of the SRAM have their power shut off suing suitably introduced gating transistors on the power supply or in the ground. The problem with this approach is that, although it reduces the power dissipation of the cell by two orders of magnitude, it loses data: When gated-VDD method is used, the charge from the storage node maintaining the logical one is gradually drained through leakage and hence stored information lost Similarly, when gated-GND approach is implemented, the storage node maintaining the logical zero is being gradually charged though leakage.

For these reasons, there is a need in the industry for an improved method for maintaining charge on the storage nodes so that memory power in standby (sleep) mode is reduced, while the information is maintained reliably. This application discloses several methods and improved SRAM memory cell improvements that achieve improved storage maintenance under low power consumption.

BRIEF DESCRIPTION OF THE INVENTION

In order to reduce the DRV and the DRV margin, PMOS load transistors' sub-threshold current is replaced with more temperature stable current to compensate the gate leakage current. This application discloses a method to realize this using current generation via a photoconductive effect in the SRAM semiconductor chip from a light source external to the SRAM chip. FIG. 12 illustrates qualitatively the I-V characteristics of a photodiode and the modes of operation. In particular, photoconductive current generation refers to quadrant III, where each photon reaching the semiconductor is first converted into an electron-hole pair, and then is converted to electrical current due to the built in electric field of the pn-junction at reverse bias. Absorption and conversion coefficients for light to current are significantly less temperature dependent than the sub-threshold currents of MOS transistors. This is readily observable if one compares the temperature dependence of currents in FIG. 9 with the data in FIG. 17, which shows the temperature coefficient of typical pn-photodiode characteristics for various wavelengths. With properly adjusted light generation, conversion, and diffusion low temperature leakage is fully compensated by light-generated carriers rather than a large DRV and DRV margin, resulting in standby operation of a SRAM with lower standby supply voltage and, hence, lower power dissipation. The power required to generate the light, on the other hand, may come from a number of external sources: mobile device keyboard or display, ambient light, or may be powered from an efficient light-emitting diode. Overall power dissipation in standby mode of the SRAM is reduced. Furthermore, there is no need to adjust the DRV depending on temperature and hence not used for this purpose. Chips do not need temperature sensors to be integrated on the chip.

In this application, the following terminology is used: SRAM in "Sleep Mode" means SRAM in low-power mode in which the SRAM power consumption is reduced to a minimum. In the Sleep Mode, SRAM does not provide read and write functionality and the data is not retained. The term "drowsy mode" refers to operating a memory cell so that its power supply is lowered to the minimum voltage that retains the information in the cell. The term "Deep Sleep" refers to the mode of SRAM operation in which a portion of the SRAM has it cells gated-VDD/GND for the purpose of power-down while a portion of the SRAM is still power and operational. Powered-down means disconnecting the power supply (VDD) or ground (GND). Information is lost in Deep Sleep mode.

The purposes of the invention are (a) to reduce drowsy-mode power dissipation in SRAMs by reducing the required low-temperature DRV when power reduction of SRAMs is accomplished by reducing the using lower supply voltage, and (b) enable data retention when SRAM is placed into deep-sleep mode by gating its power supply or ground terminals.

DETAILED DESCRIPTION OF THE EMBODIMENTS

Figure 1:
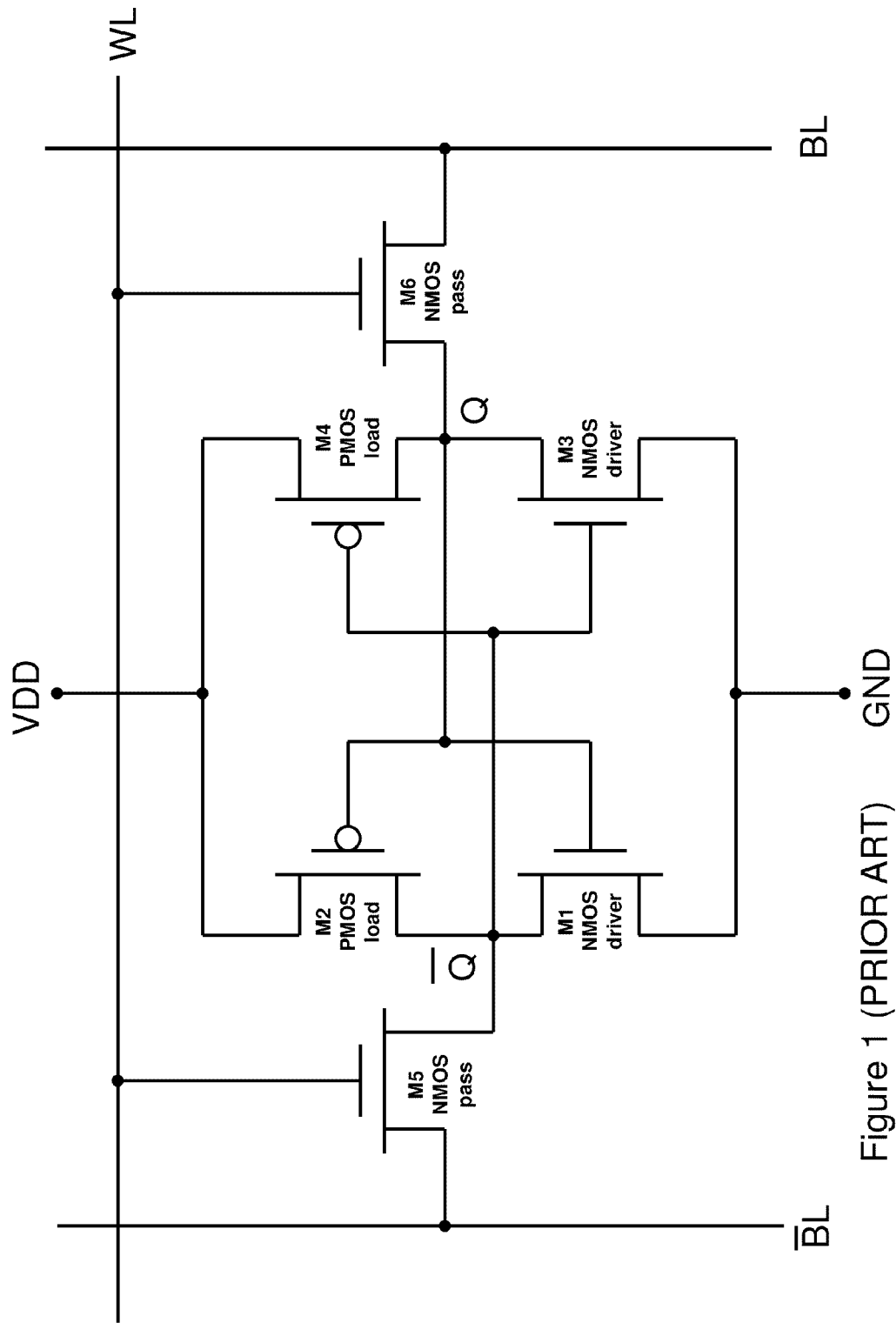
FIG. 1: Circuit diagram of a common 6T SRAM cell (PRIOR ART)
Figure 2:
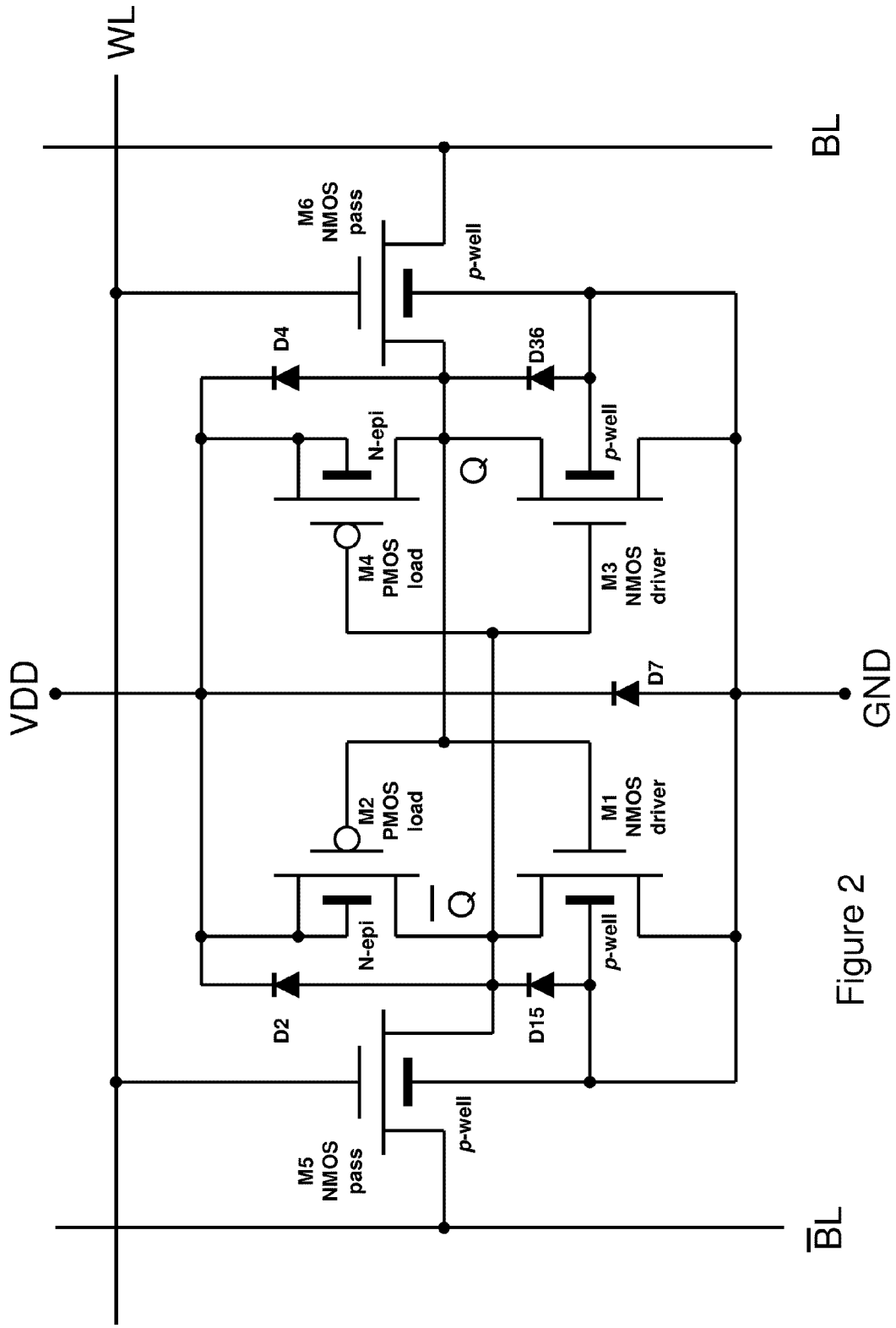
FIG. 2: Circuit diagram of a common 6T SRAM cell with epilayer and substrate connections and pn-junctions active in this application.
Figure 3A:
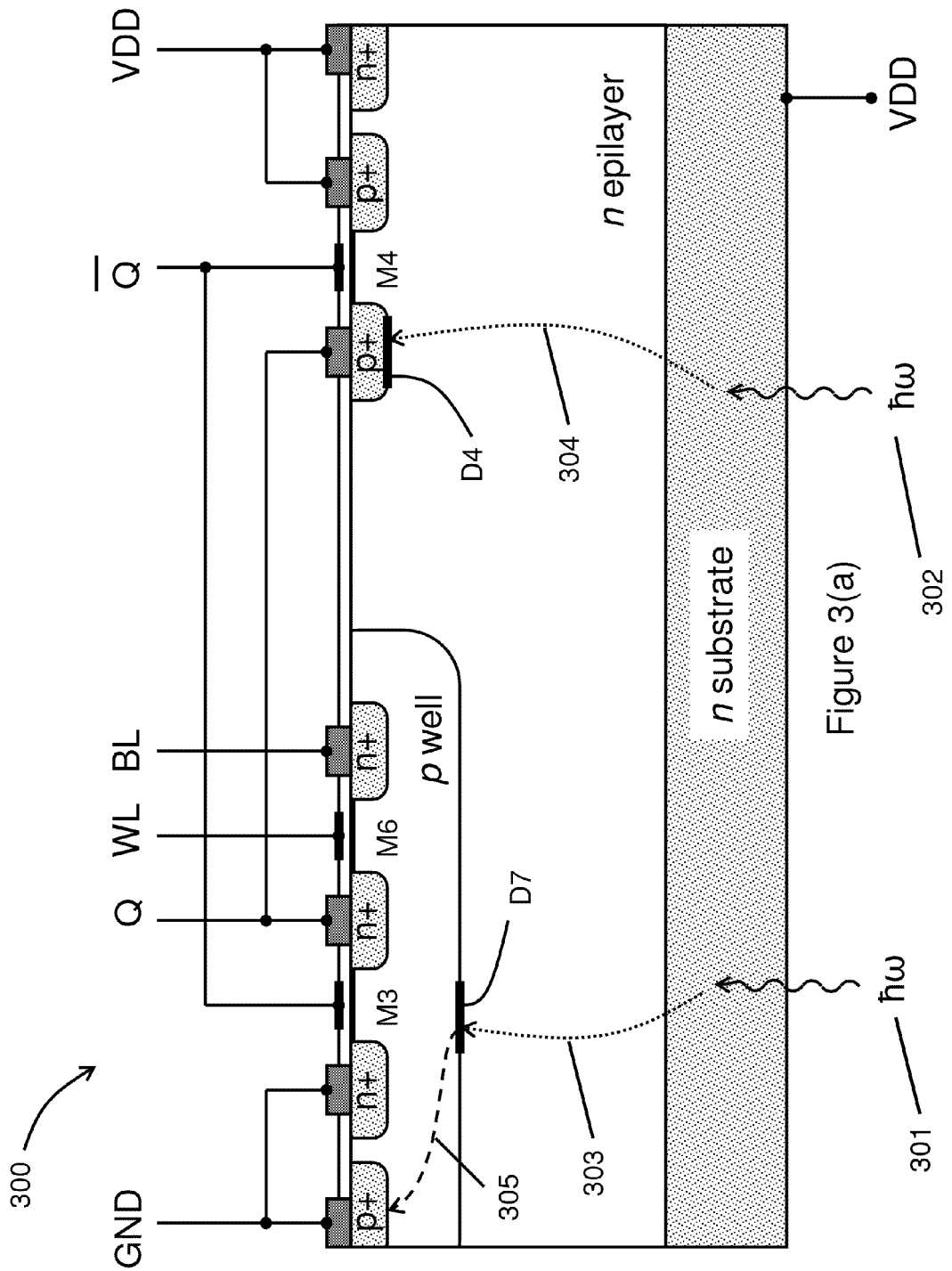
FIG. 3: (a) Vertical cross-section through one half of a 6T SRAM cell illustrating Method 1A for optical refreshing the memory cell while the power supply VDD is reduced. Illumination is incident from the substrate side of the chip. (b) Current sources relevant for refreshing in FIG. 3(a).
Figure 4A:
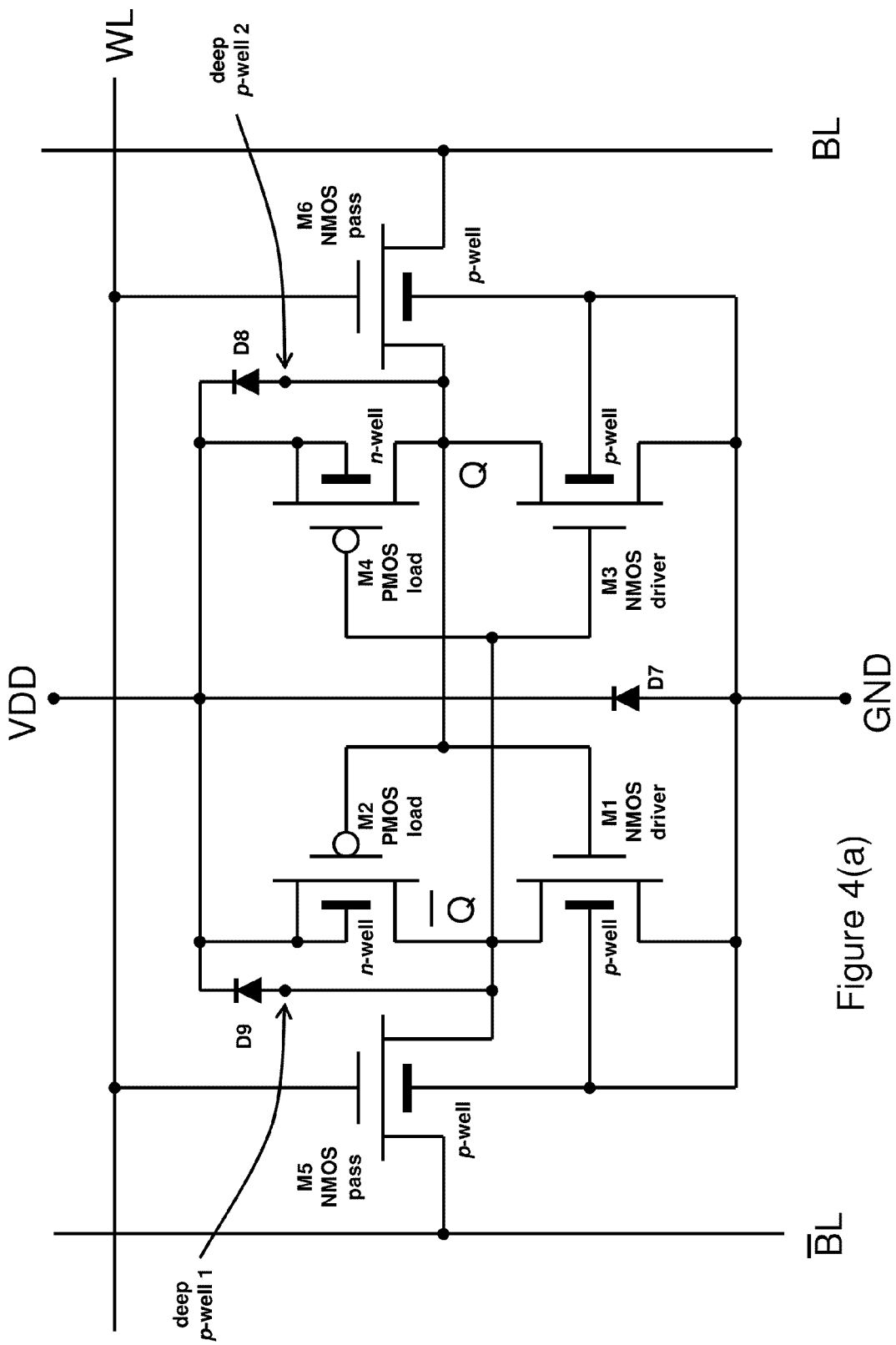
FIG. 4: (a) Circuit diagram of a 6T SRAM cell with load transistors in double-wells showing pn-junctions active in refreshing. Illumination is incident from the substrate side of the memory chip. (b) Vertical cross-section through one half of the 6T SRAM cell with a double-well.

Some of the embodiments will be disclosed with the help of circuit diagram shown in FIG. 2. FIG. 2 shows the circuit diagram of a 6T SRAM memory cell with two NMOS driver transistors M1 and M3, two PMOS load transistors M2 and M4, and two NMOS pass (access) transistors M5 and M6. Relative to FIG. 1, in FIG. 2, the bulk semiconductor below the MOS transistor channel is also indicated with solid, but thicker lines and to what potential this bulk semiconductor area is connected: The NMOS transistors M1, M3, M5, and M6 are disposed in a p-well which is connected to ground (GND) terminal, while the PMOS load transistors M2 and M4 are disposed in the n-epilayer which is connected to the power supply (VDD) terminal. The vertical cross-sections through one half of a 6T SRAM memory this memory cell (the Q half) are schematically illustrated in FIGS. 3(a) and 4(a) in connection with the description of the elements. The elements shown in FIG. 2 are also shown in FIGS. 3(a) and 4(a) with corresponding electrical connections from FIG. 2. The cell 300 has a front side on which transistors and electrical connections are disposed, and a back side, also referred to as the substrate side.

The field-effect transistors (MOS transistors) shown in the vertical cross-sectional views in FIGS. 3(a), 4(b), 5(a), 6(a), 7(b), 8(b), and 8(c) are formed by standard semiconductor processing techniques known in the art. Each of the transistors comprises of (a) source diffusion and drain diffusion regions that are degeneratively doped p+ or n+ depending on whether the transistor is an p-channel (PMOS) or n-channel (NMOS) field-effect transistors, (b) source and drain electrical terminals made out of metal deposited onto the semiconductor and forming ohmic contacts to those source and drain diffusion regions, (c) a gate terminal formed by metal, d) thin dielectric layer between the gate metal and the semiconductor surface which forms a capacitor, and e) an inversion channel through which the current flow is controlled via the gate terminal. The source and drain diffusion regions form pn-junctions with the surrounding semiconductor and in normal operation of the field-effect transistor, this pn-junction is either at zero bias or reverse bias.

Figure 4B:
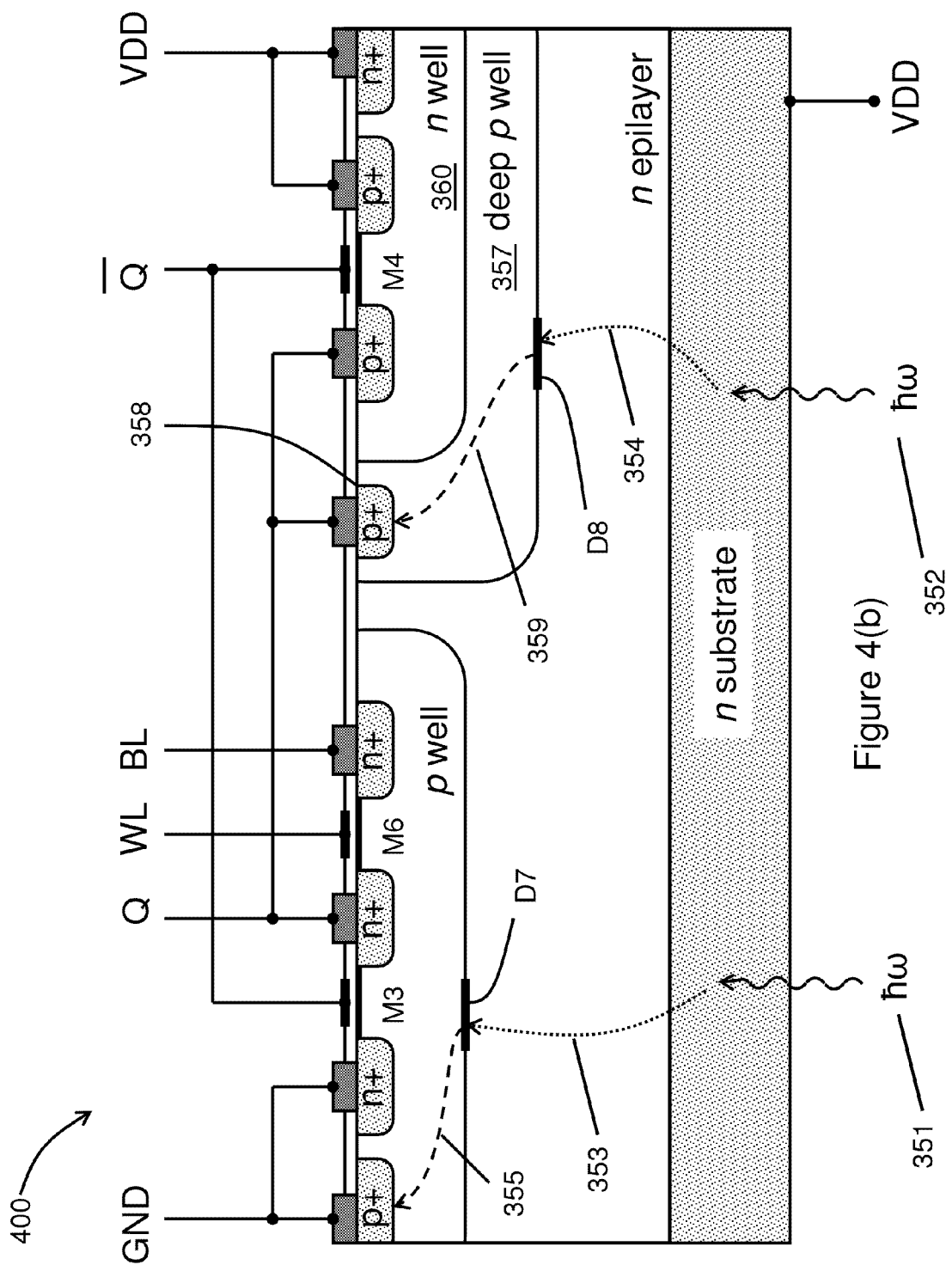

So-formed field-effect transistors may be disposed directly on an epilayer, the epilayer disposed onto a substrate (for example, transistor M4 in FIG. 3(a)), may be disposed in a larger diffused area, referred to as a "well", embedded in the epilayer (for example, transistor M6 in a p-well in FIG. 3(a)). A memory cell may utilize multiple "wells", and the wells may appear one within another. In FIG. 4(b) wells 360 and 357 form a double-well structure. Similarly, FIG. 8(c) shows a double-well structure with wells 857 and 860. In the example shown in FIGS. 4(b) and 8(c), the deeper wells (357 and 857) are referred to as the "deep well", while the shallower wells (360 and 860) as the "shallow well" or just "n-well/p-well" as indicated in the figures. The shallow and deep wells may intersect, namely, the deep well does not have to completely contain the shallow well.

The epilayer is disposed on the substrate (for example, FIG. 3(a)). It is possible to omit the epilayer and build transistors directly on a substrate. For the purposes of this application, all references to the epilayer mean epilayer or substrate and vice versa. Since the epilayer is optional, for the purposes of biasing, potentials, currents flowing through, light absorbed, or formation of pn-junctions, the epilayer and the substrate mean one and the same and the terms are used interchangeably. The methods for manufacturing and the operation of such transistors and memory cells utilizing them are well known in the art.

Embodiment 1A

Referring to FIG. 3(a), in one embodiment, a light source is positioned proximal to the substrate on the substrate side of the memory cell 300. The light source is operatively configured to emit light of a specific spectrum, having a peak wavelength, indicated with words $\hbar\omega$ (and numbers 301 and 302) and is directed towards the memory cell 300. The spectrum and the peak wavelength of the light source emission are selected to penetrate the substrate an average distance $L_{pen}$ before they get absorbed. Absorption of photons creates electron-hole pairs which are now free to diffuse through the substrate in all directions. A fraction of minority carriers diffuse towards the front of the cell 300 and reach at least the pn-junction D7 between the n-epilayer and the p-well (indicated with 303) and the pn-junction D4 between the p+drain diffusion region of PMOS pass transistor M4 and the n-epilayer (indicated with 304). The figure does not show other pn-junctions that may or may not capture these diffusing minority carriers as they are not fundamental to the operation of the memory cell refreshing. Once the minority carriers reach a pn-junction, they are swept by the built-in electric field and thereby create a DC current; the pn-junction becomes a current source with current directed from the cathode towards the pn-junction anode. Reaching the pn-junction terminates the diffusion of minority carriers as they become majority carriers on the other side of the junction. The magnitude of the generated current equals the current of minority carriers reaching the pn-junction from one side.

Figure 3B:
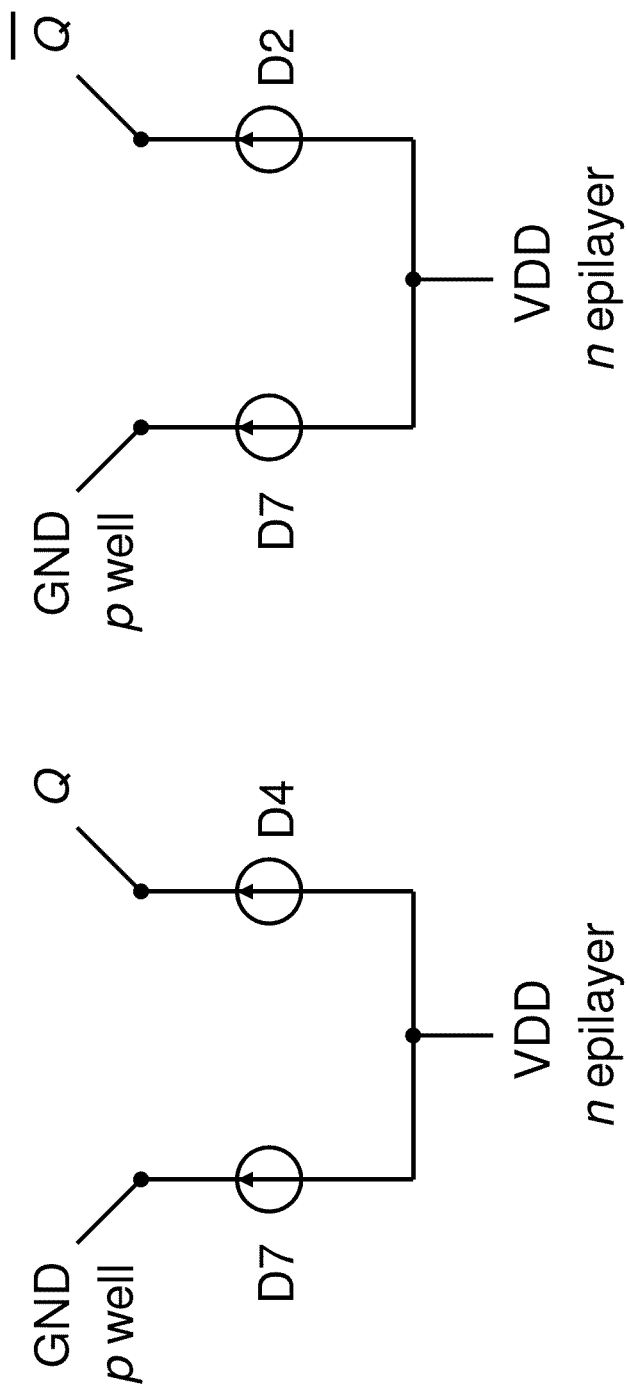

The current generated by pn-junction D7 is conducted to ground (GND) terminal (path is shown with 305); hence no diffusion of minority carriers generated in the substrate proceeds within the p-well. The current generated at pn-junction D4 by the arrival of diffusing minority carriers is the useful current that is used to refresh the storage node Q. FIG. 3(b) illustrates these relationships: pn-junction D7 generates current between the VDD and GND terminals and is hence lost (and not useful). The current generated by pn-junctions D4 and D2 charge the storage nodes thereby accomplish refreshing.

The average distance the minority carriers can diffuse is quantified by their diffusion length $L_{diff}$. Clearly, if the thickness of the substrate is $L_{sub}$, for the light source to contribute to the refreshing of the memory cell, we require that $L_{sub} \sim L_{diff} + L_{abs}$. For example, a light-emitting diode with emission centered at 1050 nm and low doped n-type substrate with absorption length of 400 um and diffusion length of 300 um, the substrate thickness may be around 700 um.

Figure 10:
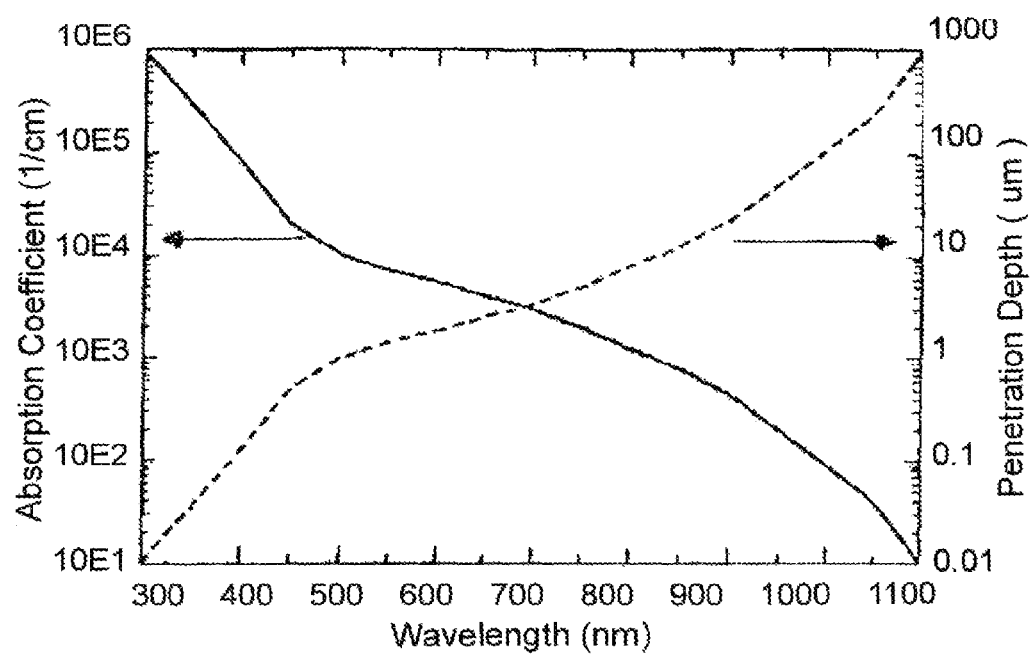
FIG. 10: Absorption coefficient and penetration of for light as a function of wavelength.
Figure 11A:
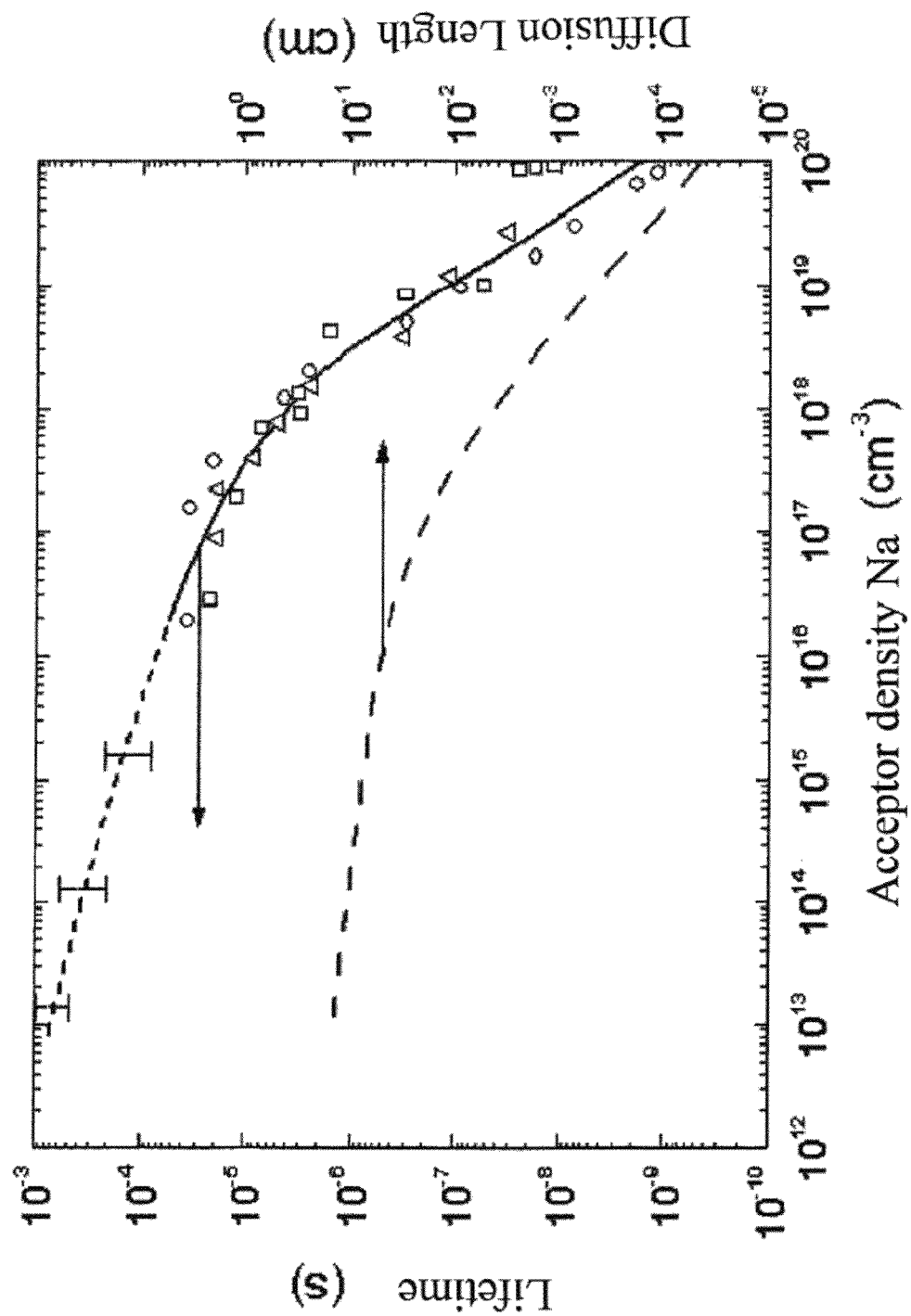
FIG. 11: Minority carrier lifetime and resulting diffusion length of (a) electrons in p-type silicon and (b) holes in n-type silicon as a function of semiconductor doping.
Figure 11B:
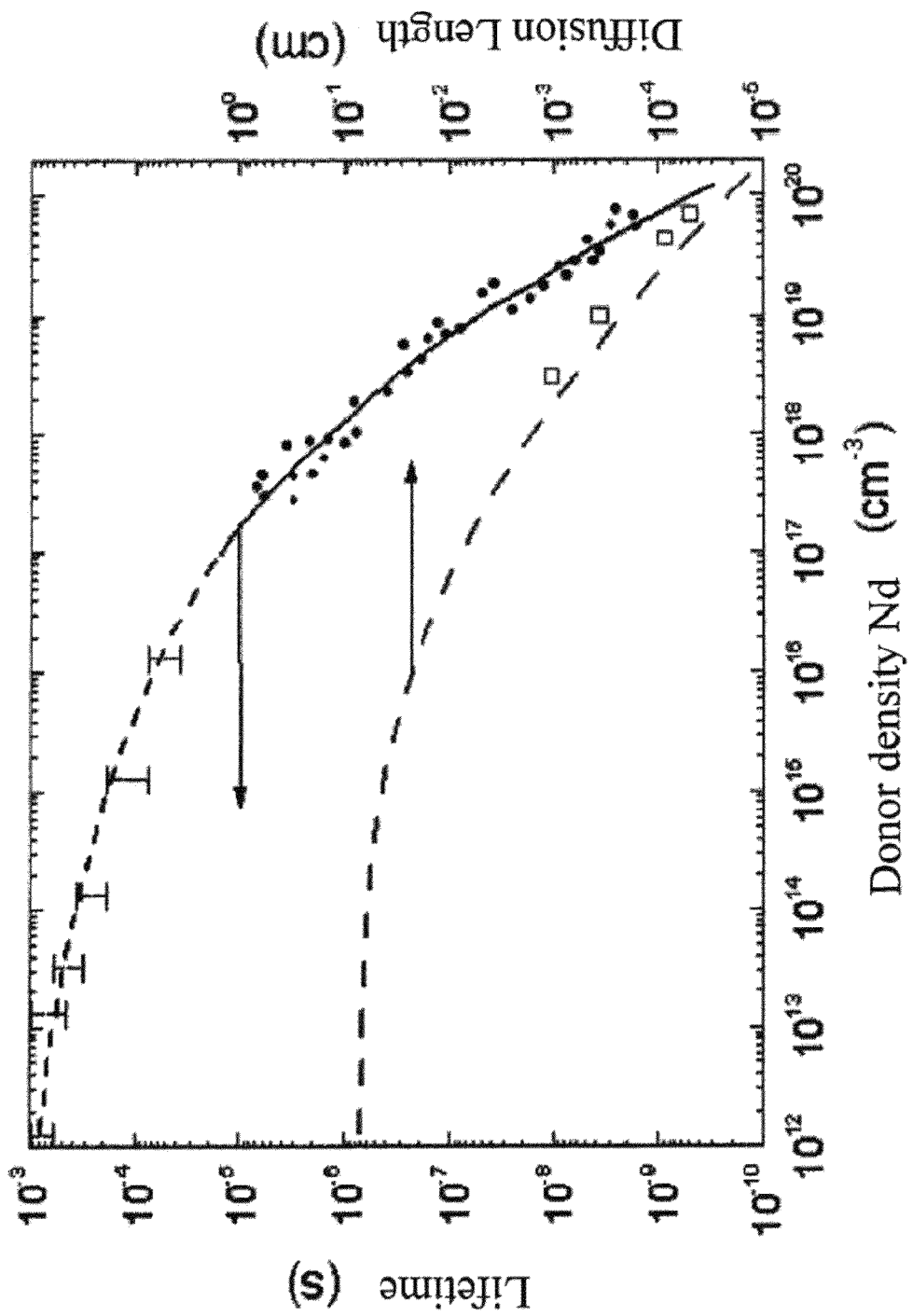
Figure 12:
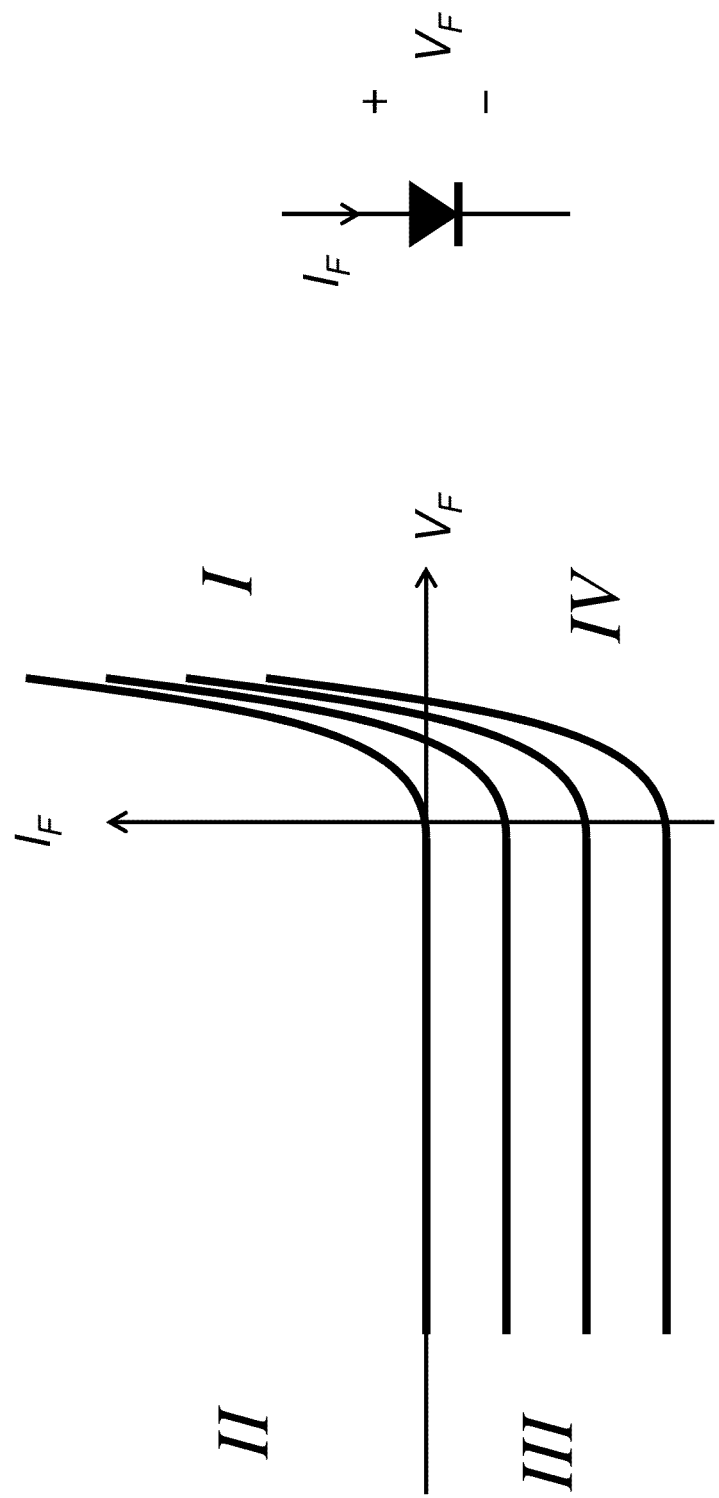
FIG. 12: Illustration of current-voltage characteristics of a pn-junction under illumination with polarization conventions.

FIG. 10 shows publicly available data on the absorptance and penetration depth for light of certain wavelength into silicon. FIGS. 11(a) and 11(b) show publicly available data on the diffusion length in silicon substrates of different doping levels. Typical substrate doping levels are in the $10^{15}$ and $10^{16}$ cm$^{-3}$ range. These graphs support the example mentioned above and are used as further guidance to implement the device and method.

Embodiment 1B

The embodiment 1B is disclosed with the help of FIGS. 4(a) and 4(b). FIG. 4(a) shows the circuit diagram of a 6T SRAM memory cell with two NMOS driver transistors M1 and M3, two PMOS load transistors M2 and M4, and two NMOS pass (access) transistors M5 and M6. The bulk semiconductor below the MOS transistor channels is indicated with solid, but thicker line and it shows to what potential the below-channel region is connected: The NMOS transistors M1, M3, M5, and M6 are disposed in a p-well which is connected to ground (GND) terminal, while the PMOS load transistors M2 and M4 are disposed in a double well structures: n-well 360 within a deep p-well 357 (shown in FIG. 4(b)). The n-well 360 is connected to the power supply (VDD) terminal, while the deep p-well 357 is connected to a separate p+ terminal 358, which in turn is connected to the storage node Q. The vertical cross-sections through one half of 6T SRAM memory cell shown in FIG. 4(a) are schematically illustrated in FIGS. 4(b) in connection with the description of the elements.

In one embodiment, a light source is positioned proximal to the substrate on the substrate side of the memory cell 400. The light source is operatively configured to emit light of a specific spectrum, having a peak wavelength, indicated with words $\hbar\omega$ (and numbers 351 and 352) and is directed towards the memory cell 400. The spectrum and the peak wavelength of the light source emission are selected to penetrate the substrate an average distance $L_{pen}$ before they get absorbed. Absorption of photons creates electron-hole pairs which are now free to diffuse through the substrate in all directions. A fraction of minority carriers diffuse towards the front of the cell 400 and reach at least the pn-junction D7 between the n-epilayer and the p-well (indicated with 353) and the pn-junction D8 between the deep p-well and the n-epilayer (indicated with 354). The figure does not show other pn-junctions that may or may not capture these diffusing minority carriers as they are not fundamental to the operation of the memory cell refreshing. Once the minority carriers reach a pn-junction, they are swept by the built-in electric field and thereby create a DC current; the pn-junction becomes a current source with current directed from the cathode towards the pn-junction anode. Reaching the pn-junction terminates the diffusion of minority carriers as they become majority carriers on the other side of the junction. The magnitude of the generated current equals the current of minority carriers reaching the pn-junction from one side.

The current generated by pn-junction D7 is conducted to ground (GND) terminal (path is shown with 355); hence no diffusion of minority carriers generated in the substrate proceeds within the p-well. The current generated at pn-junction D8 by the arrival of diffusing minority carriers is conducted through deep p-well (shown with dashed arrow 359) to the p+ terminal 358 from where it charges storage node Q. FIG. 4(b) shows only one half of the memory cell 400, where in it is clear that the same functionality is accomplished in the other half. There has to be two deep p-wells 357 per cell, one for each storage node, because each deep p-well 357 is connected to a different storage node. In FIG. 4(a), the current generated by pn-junctions D8 and D9 charge the storage nodes Q and Q-bar accomplishing refreshing. The pn-junctions D10 and D11 between the deep p-well and the n-well do not generate any current.

The average distance the minority carriers can diffuse is quantified by their diffusion length $L_{diff}$. Clearly, if the thickness of the substrate is $L_{sub}$, for the light source to contribute to the refreshing of the memory cell, we require that $L_{sub} \sim L_{diff} + L_{abs}$. For example, a light-emitting diode with emission centered at 1050 nm and low doped n-type substrate with absorption length of 400 um and diffusion length of 300 um, the substrate thickness may be around 700 um. The reason for using a deep p-well 357 in this embodiment is to enlarge the capture surface for the minority carriers diffusing from the substrate as a result of illumination from the back.

Embodiment 2A

Figure 5A:
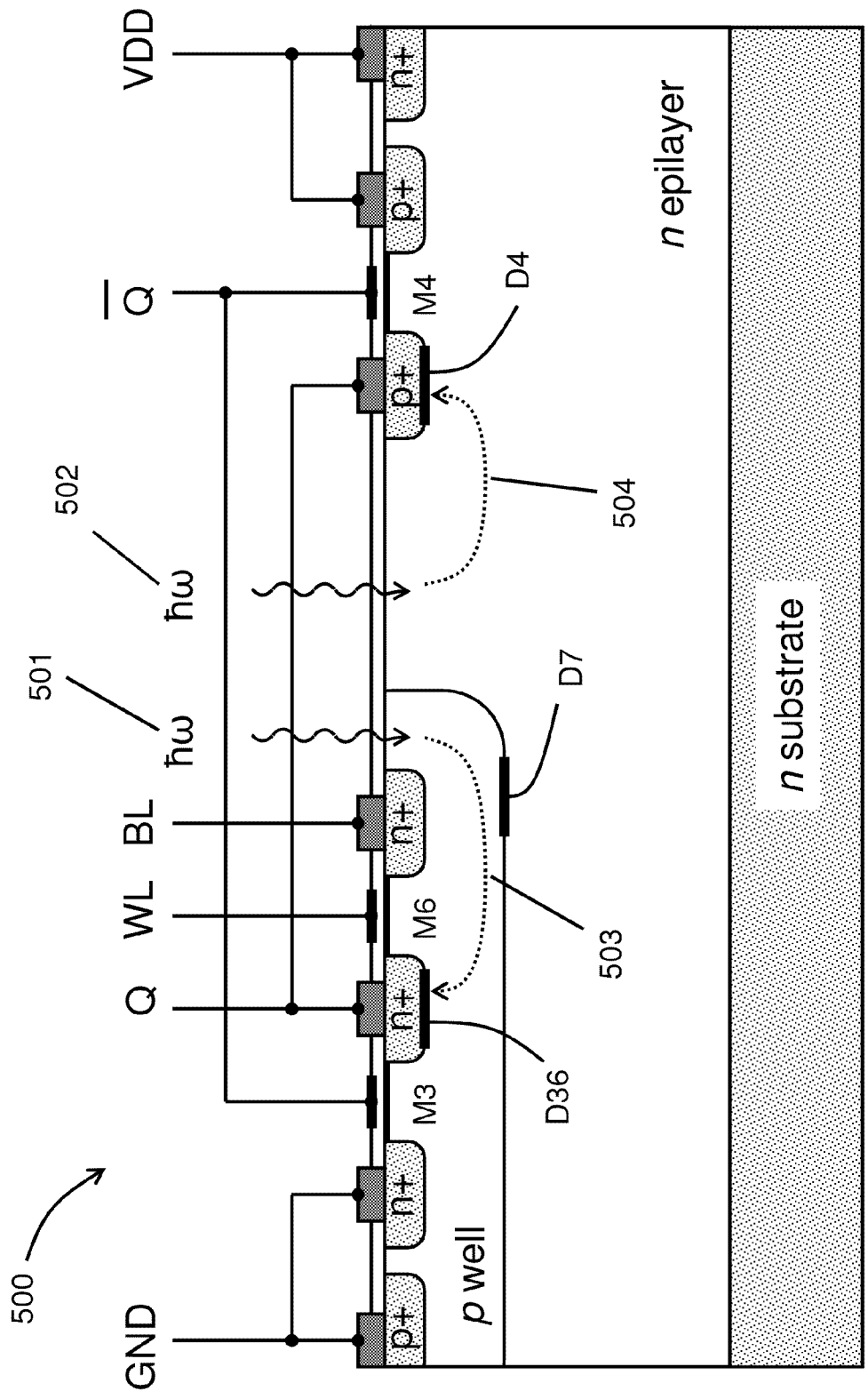
FIG. 5: (a) Vertical cross-section through one half of a 6T SRAM cell illustrating Method 1A for optical refreshing the memory cell while the power supply VDD is reduced. Illumination is incident from the front of the memory chip. (b) Current sources relevant for refreshing in FIG. 5(a).
Figure 5B:
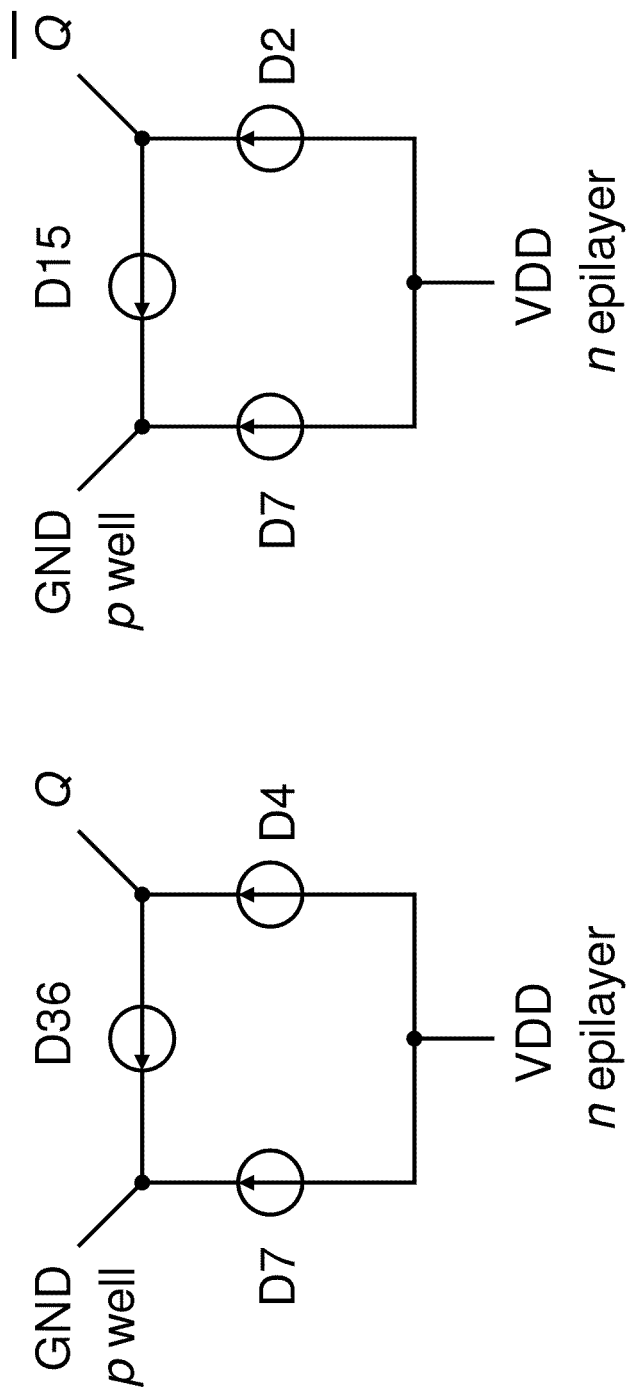

Embodiment 2A is disclosed with the help of circuit diagram shown in FIG. 2, the vertical epilayer/device cross-section shown in FIG. 5(a), and circuit-diagram equivalent shown in FIG. 5(b). Referring to FIG. 5(a), in one embodiment, a light source is positioned proximal to the front side of the memory cell 500. The light source is operatively configured to emit light of a specific spectrum, having a peak wavelength, indicated with words ℏ ω (and numbers 501 and 502) and is directed towards the memory cell 500 from the front side. The spectrum and the peak wavelength of the light source emission are selected to penetrate the substrate an average distance $L_{pen}$ before they get absorbed. Absorption of photons creates electron-hole pairs which are now free to diffuse through the substrate in all directions. A fraction of minority carriers reaches, by diffusion, at least the pn-junction D36 between the storage node Q n+ contact diffusion and the p-well (indicated with 503) and the pn-junction D4 between the p+drain of PMOS pass transistor M4 and the n-epilayer (indicated with 504). The figure does not show other pn-junctions that may or may not capture these diffusing minority carriers as they are not fundamental to the operation of the memory cell refreshing. Once the minority carriers reach a pn-junction, they are swept by the built-in electric field and thereby create a DC current; the pn-junction becomes a current source with current directed from the cathode towards the pn-junction anode. The magnitude of the generated current equals the current of minority carriers reaching the pn-junction from one side. If pn-junction D4 is exposed to the illumination 502, the pn-junction D4 will generate photo current directly by photon absorption. The generated current adds to the current provided by diffusing minority carriers 504.

The current paths and sources are summarized in FIG. 5(b). The current generated by pn-junction D7 is conducted to ground (GND) terminal hence no diffusion of minority carriers generated in the substrate proceeds within the p-well. The current generated at pn-junction D4 by the arrival of diffusing minority carriers is the useful current that is used to refresh the storage node Q, while current generated by pn-junction D36 discharges the storage node Q. FIG. 5A illustrates these relationships: pn-junction D7 generates current between the VDD and GND terminals and is hence lost (and not useful). The current generated by pn-junctions D4 and D2 charge the storage nodes thereby accomplish refreshing, but currents generated by pn-junctions D36 and D15 discharge the storage node. It is essential that the ratio of p-well volume available for photon absorption to the n-epilayer area available for photon absorption in cell 500 be as small as possible. The absorption volume of the p-well area controls the amount of current reaching D36, which should be minimized, while the absorption volume of the n-epilayer controls the amount of current reaching pn-junction D4 and hence should be maximized.

Embodiment 2B

Figure 6A:
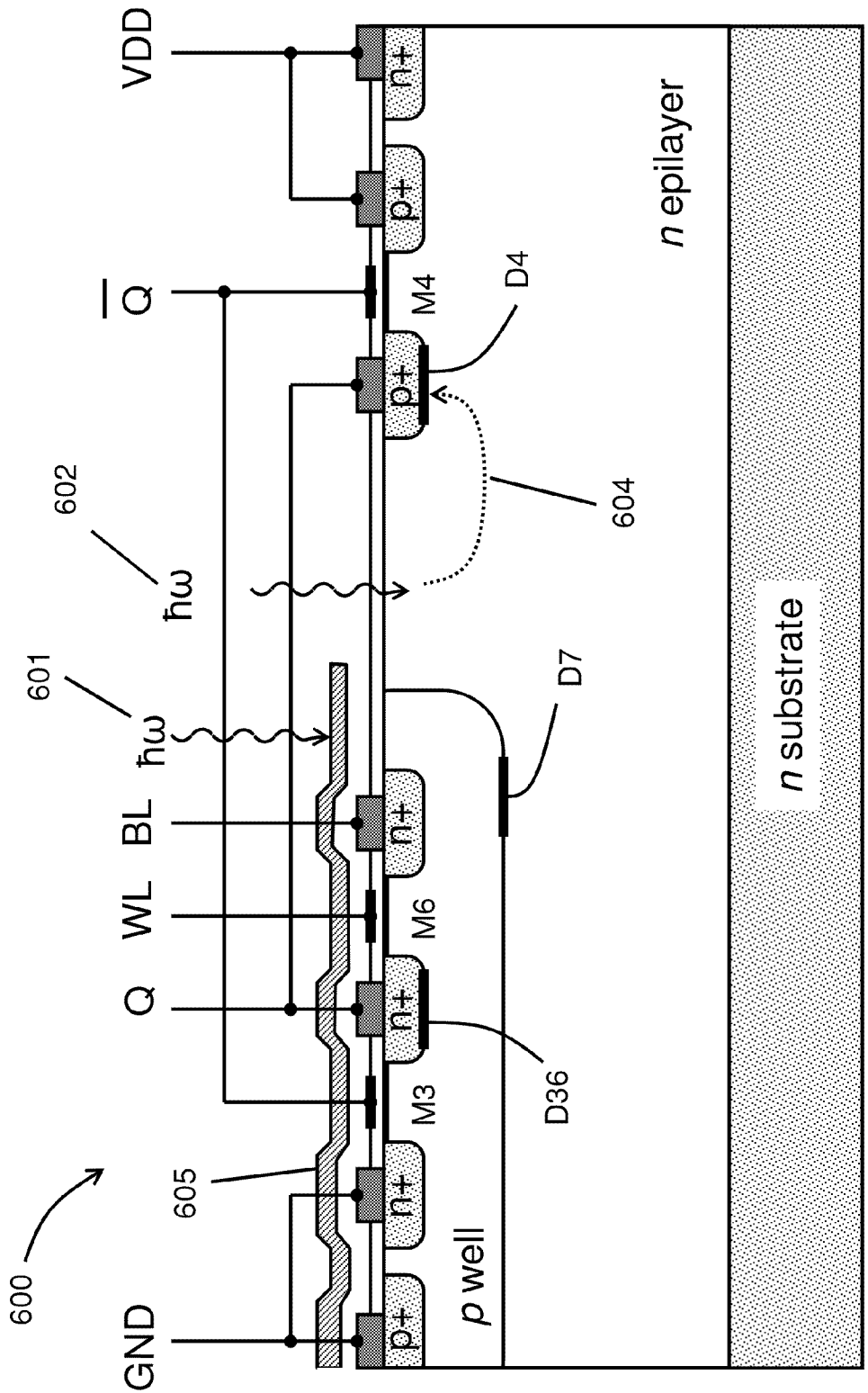
FIG. 6: (a) Vertical cross-section through one half of a 6T SRAM cell illustrating Method 1A for optical refreshing the memory cell while the power supply VDD is reduced. Illumination is incident from the front of the memory chip. (b) Current sources relevant for refreshing in FIG. 6(a).
Figure 6B:
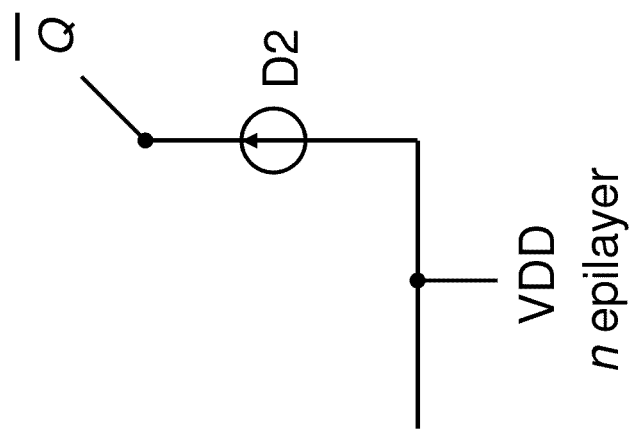
Figure 6B:
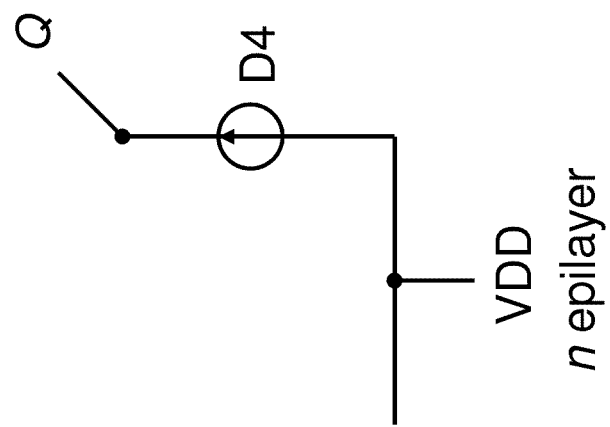

Embodiment 2B is disclosed with the help of circuit diagram shown in FIG. 2, the vertical epilayer/device cross-section shown in FIG. 6(a), and circuit-diagram-equivalent shown in FIG. 6(b). In one embodiment, a light source is positioned proximal to the front side of the memory cell 600 (FIG. 6(a)). The light source is operatively configured to emit light of a specific spectrum, having a peak wavelength, indicated with words ℏ ω (and numbers 601 and 602) and is directed towards the memory cell 600 from the front side. The spectrum and the peak wavelength of the light source emission are selected to penetrate the substrate an average distance $L_{pen}$ before they get absorbed. Absorption of photons creates electron-hole pairs which are now free to diffuse through the substrate in all directions. The memory cell 600 includes a layer of light-absorbing material 605 covering the p-well region. The material is preferably polysilicon or metal and a large fraction of incident photons (601) are absorbed in this absorbing layer and hence do not reach the p-well below it. Photons 602 that reach the uncovered areas of the n-epilayer are absorbed in the n-epilayer and the generated minority carriers reach, by diffusion, at least the pn-junction D4 between the p+drain of PMOS pass transistor M4 and the n-epilayer (indicated with 604). The figure does not show other pn-junctions that may or may not capture these diffusing minority carriers as they are not fundamental to the operation of the memory cell refreshing. Once the minority carriers reach a pn-junction, they are swept by the built-in electric field and thereby create a DC current; the pn-junction becomes a current source with current directed from the cathode towards the pn-junction anode. The magnitude of the generated current equals the current of minority carriers reaching the pn-junction from one side.

For this embodiment, the current paths and sources are summarized in FIG. 6(b). The current generated by pn-junctions D4 and D2 charge the storage nodes thereby accomplish refreshing, while pn-junctions D36 and D15 do not generate any current.

Gated Supply or Ground Embodiments

Figure 7A:
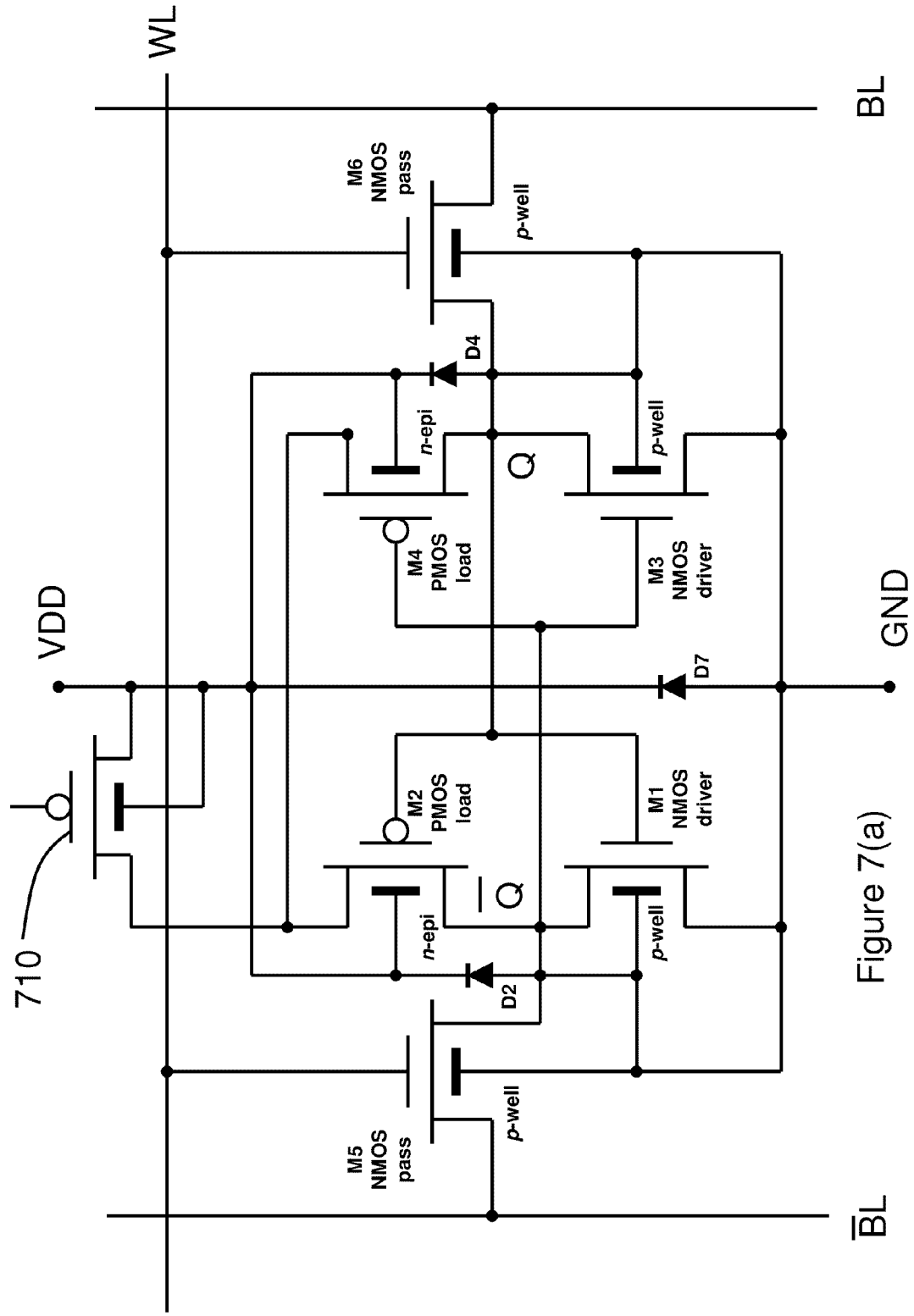
FIG. 7: (a) Circuit diagram of a 6T SRAM cell with gated-VDD configuration. (b) Vertical cross-section through one half of a 6T SRAM cell with gated-VDD.
Figure 7B:
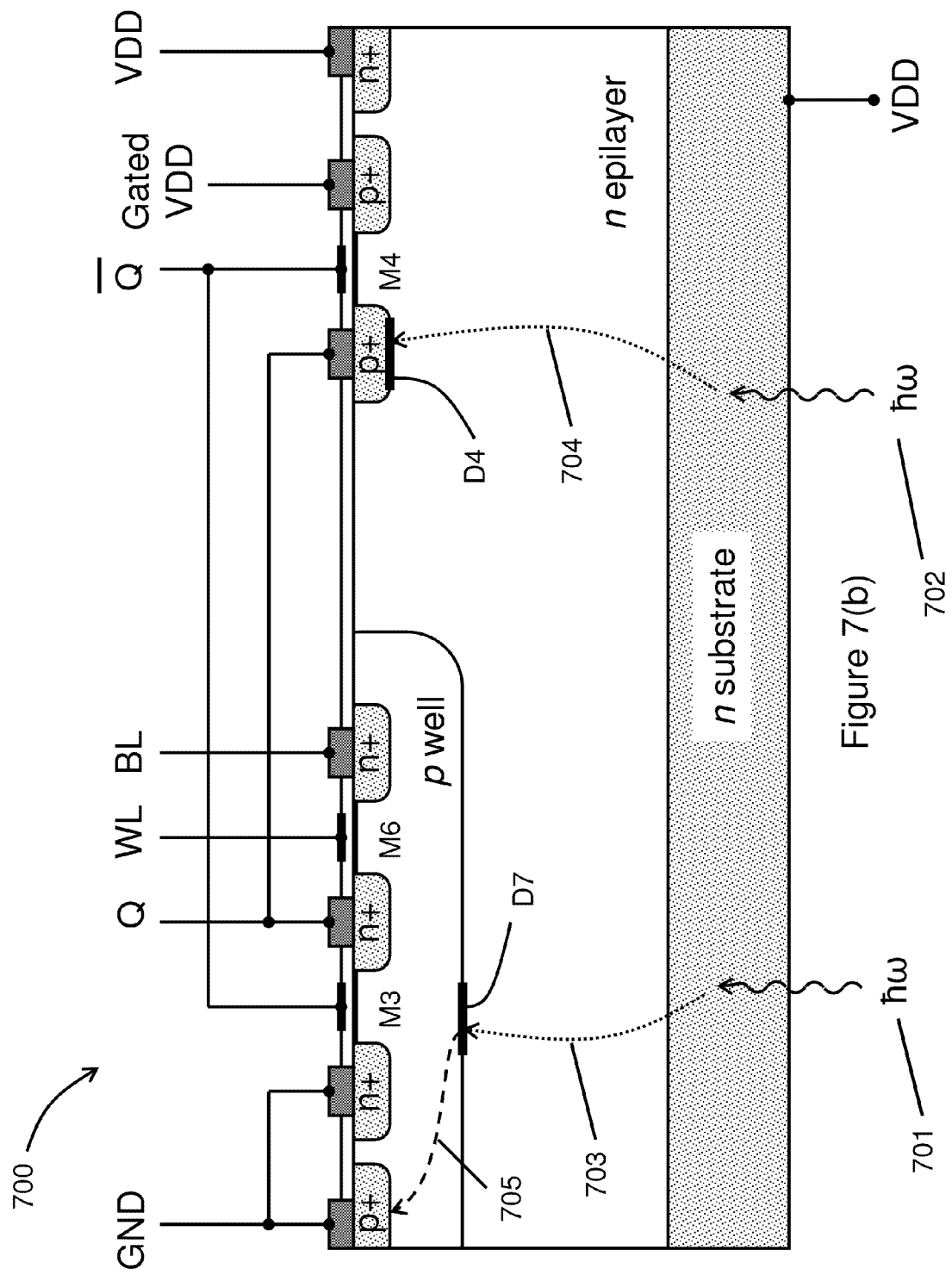
Figure 8A:
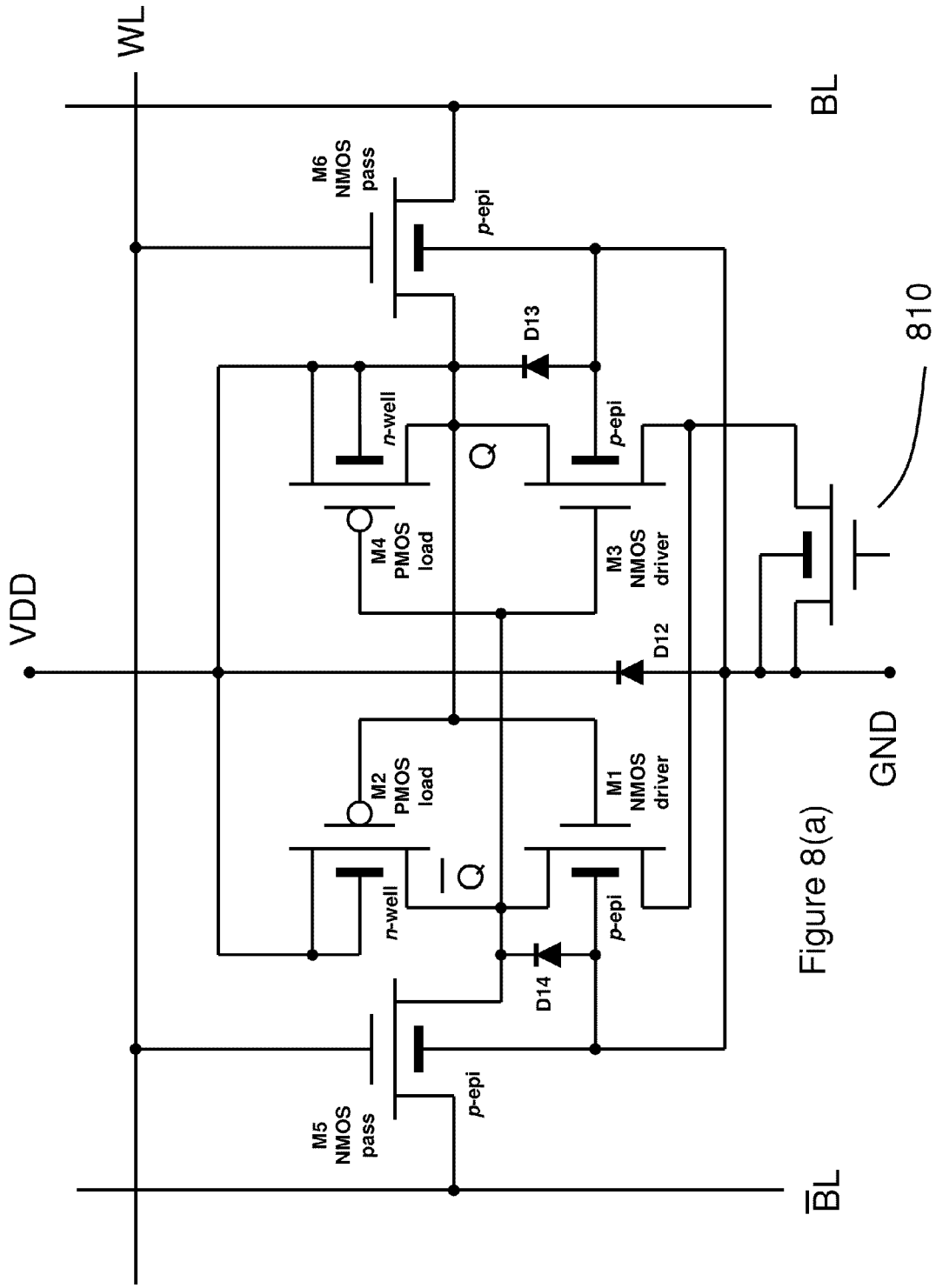
FIG. 8: (a) Circuit diagram of a 6T SRAM cell with gated-GND configuration. (b) Vertical cross-section through one half of a 6T SRAM cell with gated-GND. (c) Vertical cross-section through one half of a 6T SRAM cell with gated-GND and a double-well.
Figure 8B:
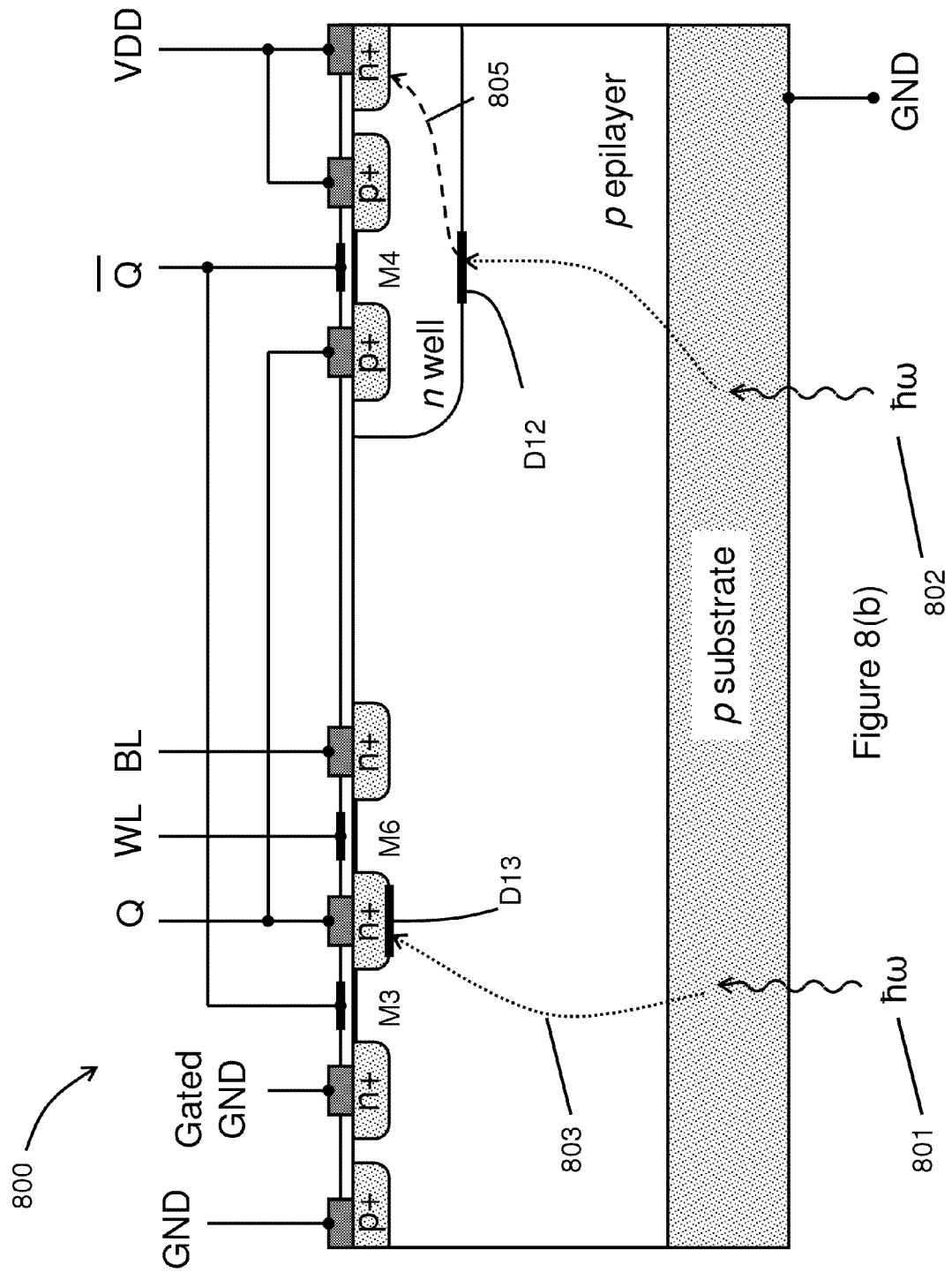
Figure 8C:
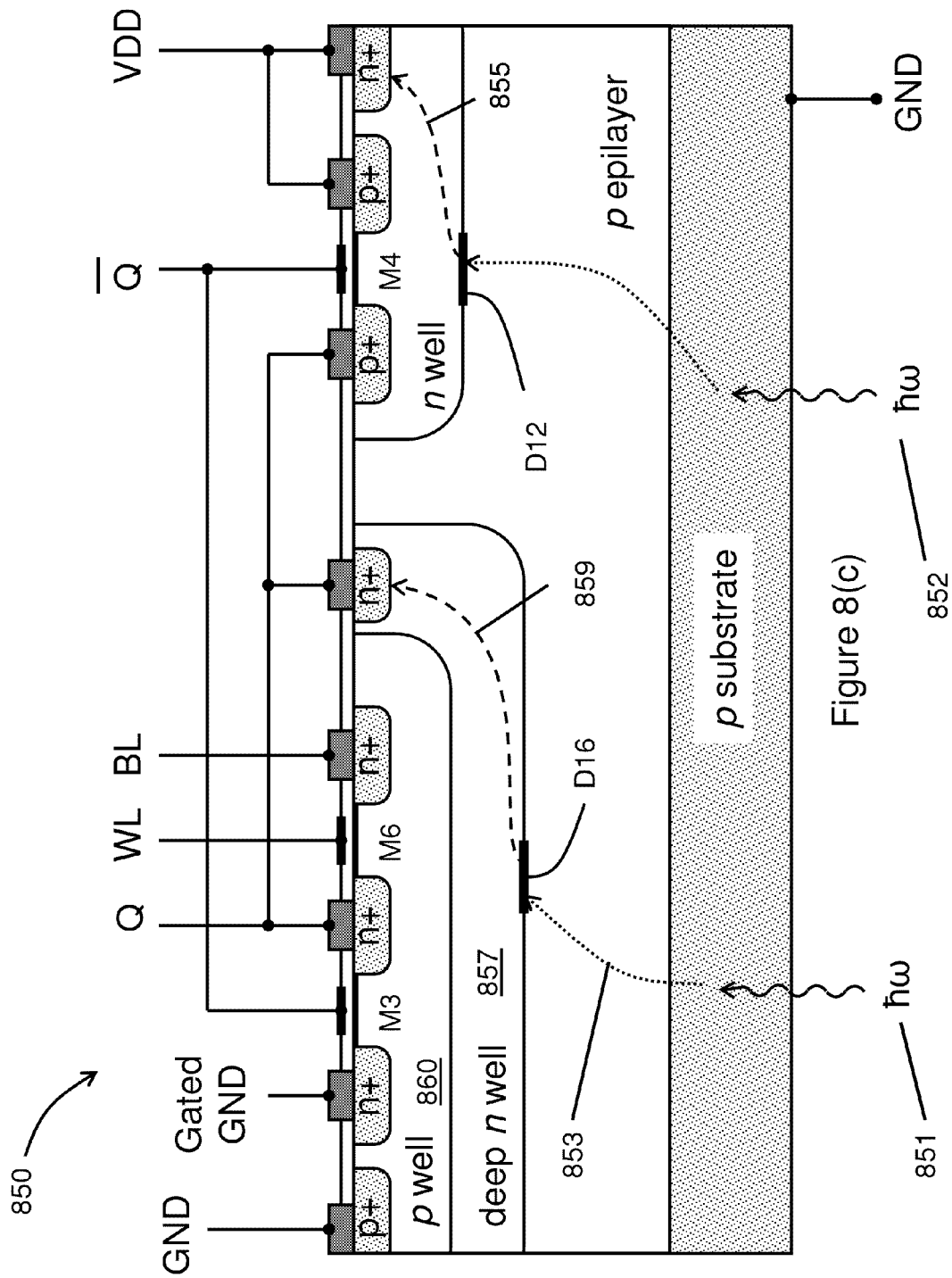
Figure 9:
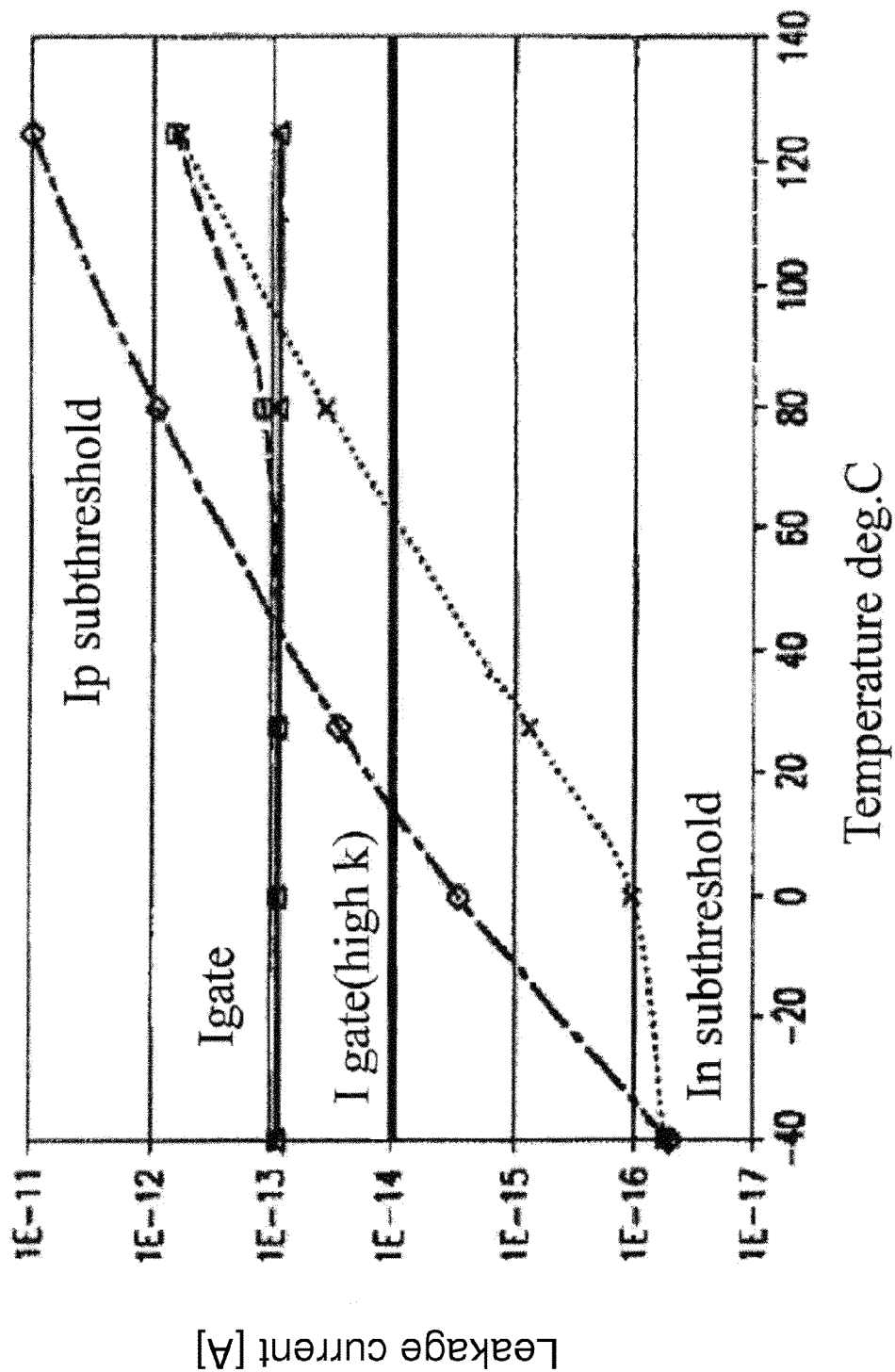
FIG. 9: Illustration showing relative magnitude of different leakage current components in a SRAM memory cell.

Embodiments 3A, B, and C are disclosed with the help of the circuit diagram shown in FIGS. 7(a) and 8(a) and the cross-sections of the epilayers/device shown in FIG. 7(b) and FIGS. 8(b) and 8(c).

Gating of the supply voltage, also known as gated-VDD technique is one of the methods for reducing leakage in memories. This circuit approach is disclosed in a publication by M. Powell, et al., "Gated-Vdd: A Circuit Technique to Reduce Leakage in Deep-Submicron Cache Memories", and published at the ISLPED 2000, Rapallo, Italy. In this technique the supply voltage to the memory cell or the portion of the memory is turned off to eliminate virtually all leakage by inserting an extra transistor between the supply terminal of a cell (sources of the load transistors) and the power supply VDD, or between the ground terminal of the cell (sources of the driver transistors) and the system ground (GND).

Cache data arrays are usually organized in banks. Each bank contains SRAM cell rows, with each cell row containing one or more cache blocks. The gated-Vdd transistor is shared among multiple memory blocks to compensate the overhead. PMOS cell transistors do not participate in read operations so the PMOS gated-Vdd transistor does not impact the cell operation. Area overhead is negligible for PMOS gated-Vdd because the transistor is the size of any of the blocks PMOS load transistors. The difficulty with type of leakage reduction approach is that it cannot be used in cache memories with large utilization ratio. Namely, due to introduction of virtual supply (VDD), the PMOS load transistors become nonfunctional and cannot hold logical "1" on charge nodes. This problem is resolved by charging the nodes with carriers diffusing from the substrate that have originated from illumination.

Another option for leakage reduction is generating a virtual ground by incorporating an NMOS transistor between driver NMOS sources and the system ground. This approaches decreases leakage much further due to eliminating of bitline to driver transistor leakage path. Stacking effect is much bigger due to three transistors in series connection. However, there is a large area overhead because NMOS transistor must be much wider to sink current from all cells connected to gated-ground NMOS transistor. Increasing the NMOS width however increases cell read time 6%. However, increase in cell read time is not significant because it is only a fraction of the cache's access time.

When the gated-ground transistor is on, the cell operates as conventional SRAM. Turning the ground terminal off cuts off the leakage path from the cell node that is at "1" to ground. At the same time it also cuts off the possibility to clamp the cell node at "0" firmly to ground. This makes it possible for reverse biased junction leakage to write "1" to that node. This source of error can be prevented if the Q-node was appropriately discharged using carriers diffusing from the substrate that have originated from illumination of the substrate.

Thus both ideal methods for leakage reduction suffer from data loss and can't be used in caches with large utilization ratio. Embodiments 3A, 3B, and 3C describe methods for reducing (or compensating) the remaining low leakage in the gated-VDD and gated-GND configurations, respectively. In this way data is preserved.

The average distance the minority carriers can diffuse is quantified by their diffusion length $L_{diff}$. If the thickness of the substrate is $L_{sub}$, for the light source to contribute to the refreshing of the memory cell, we require that $L_{sub} \sim L_{diff} + L_{abs}$. For example, a light-emitting diode with emission centered at 1050 nm and low doped n-type substrate with absorption length of 400 um and diffusion length of 300 um, the substrate thickness may be around 700 um.

Embodiment 3A

FIG. 7(a) illustrates a circuit diagram of a Gated-Vdd SRAM memory cell. The VDD is gated using PMOS transistor 710. When the transistor is off, the supply to the cell is turned off, but the supply (VDD) is still maintained to the substrate and the epilayer as shown in FIG. 7(a). In FIG. 7(b), this gating is shown by connecting the source of the PMOS to "Gated VDD", rather than to VDD. In order to maintain charge on the storage node Q, it is necessary to compensate the leakage currents from the storage node and this is done using charge provided by charge generated by absorption of light incident from the substrate and diffusing from the substrate to the pn-junction D4.

Referring to FIG. 7(b), in one embodiment, a light source is positioned proximal to the substrate on the substrate side of the memory cell 700. The light source is operatively configured to emit light of a specific spectrum, having a peak wavelength, indicated with words $\hbar \omega$ (and numbers 701 and 702) and is directed towards the memory cell 700. The spectrum and the peak wavelength of the light source emission are selected to penetrate the substrate an average distance $L_{pen}$ before they get absorbed. Absorption of photons creates electron-hole pairs which are now free to diffuse through the substrate in all directions. A portion of minority carriers diffuse towards the front of the cell 700 and reach at least the pn-junction D4 between the p+drain of PMOS pass transistor M4 and the n-epilayer (indicated with 704). The figure does not show other pn-junctions that may or may not capture these diffusing minority carriers as they are not fundamental to the operation of the memory cell refreshing. Once the minority carriers reach a pn-junction, they are swept by the built-in electric field and thereby create a DC current; the pn-junction becomes a current source with current directed from the cathode towards the pn-junction anode. Reaching the pn-junction terminates the diffusion of minority carriers as they become majority carriers on the other side of the junction. The magnitude of the generated current equals the current of minority carriers reaching the pn-junction from one side.

The current generated by pn-junction D7 is conducted to ground (GND) terminal (path is shown with 705); hence no diffusion of minority carriers generated in the substrate proceeds within the p-well. The current generated at pn-junction D4 by the arrival of diffusing minority carriers is the useful current that is used to refresh the storage node Q. The current generated by pn-junctions D4 and D2 charge the storage nodes thereby accomplish refreshing.

Embodiment 3B

Embodiment 3B is disclosed with the help of the circuit diagram shown in FIG. 8(a) and the cross-section of the epilayers/device shown in FIG. 8(b). In this embodiment, the ground is gated, namely, the ground terminal of the memory cell (sources of the driver transistors) and the system ground (GND) can be disconnected using a separate NMOS transistor 810.

FIG. 8(a) illustrates a circuit diagram of a Gated-Ground SRAM memory cell. This cell is built on a p-substrate on top of which there is an optional p-epilayer. The system GND is gated using NMOS transistor 810. When the transistor is off, the ground to the cell is removed, but the grounding of the substrate and the p-epilayer as shown in FIG. 8A remains. In FIG. 8B, this gating is shown by connecting the source of the NMOS to "Gated GND", rather than to GND. In order to maintain zero charge logical zero (low voltage) on the storage node Q, it is necessary to compensate the charging leakage currents or noise to the storage node and this is done using charge provided by discharging photocurrent generated by absorption of light incident from the substrate and diffusing from the substrate to the pn-junction D13.

Referring to FIG. 8(b), in one embodiment, a light source is positioned proximal to the substrate on the substrate side of the memory cell 800. The light source is operatively configured to emit light of a specific spectrum, having a peak wavelength, indicated with words $\hbar \omega$ (and numbers 801 and 802) and is directed towards the memory cell 800. The spectrum and the peak wavelength of the light source emission are selected to penetrate the substrate an average distance $L_{pen}$ before they get absorbed. Absorption of photons creates electron-hole pairs which are now free to diffuse through the substrate in all directions. A fraction of minority carriers diffuse towards the front of the cell 800 and reach at least the pn-junction D13 between the n+drain of NMOS pass transistors M3 and M6 and the p-epilayer (indicated with 803). The figure does not show other pn-junctions that may or may not capture these diffusing minority carriers as they are not fundamental to the operation of the memory cell refreshing. Once the minority carriers reach a pn-junction, they are swept by the built-in electric field and thereby create a DC current; the pn-junction becomes a current source with current directed from the cathode towards the pn-junction anode. Reaching the pn-junction terminates the diffusion of minority carriers as they become majority carriers on the other side of the junction. The magnitude of the generated current equals the current of minority carriers reaching the pn-junction from one side.

The current generated by pn-junction D12 is conducted to Vdd terminal (path is shown with 805); hence no diffusion of minority carriers generated in the substrate proceeds within the n-well. The current generated at pn-junction D13 by the arrival of diffusing minority carriers is the current that is used to discharge storage node Q, to assist maintaining a logical zero when the ground is gated. The current generated by pn-junctions D13 and D14 discharge the storage nodes Q and Q-bar.

Embodiment 3C

Embodiment 3C is disclosed with the help of the circuit diagram shown in FIG. 8(a) and the cross-section of the epilayers/device shown in FIG. 8(c). In this embodiment, the ground is gated, i.e., the ground terminal of the cell (sources of the driver transistors) and the system ground (GND) are gated using an additional NMOS transistor 810 shown in FIG. 8(a). Embodiment 3C (cross-section in FIG. 8(c)) introduces one more innovative feature to Embodiment 3B: The collection efficiency of minority carriers diffusing from the substrate is improved using a two deep n-wells within which each there is p-well, wherein the deep n-wells are electrically connected to the two storage nodes.

In more detail, FIG. 8(a) illustrates a circuit diagram of a Gated-Ground SRAM memory cell. This cell is built on a p-substrate on top of which there is an optional p-epilayer. The system ground is gated using NMOS transistor 810. When the transistor is off, the ground to the cell is removed, but the grounding of the substrate and the p-epilayer as shown in FIG. 8(a) remains. In FIG. 8(c), this gating is shown by connecting the source of the NMOS to "Gated GND", rather than to GND. In order to maintain zero charge during logical "0" on the storage node Q, it is necessary to compensate the charging leakage currents or noise to the storage node and this is done using charge provided by discharging photocurrent generated by absorption of light incident from the substrate and diffusing from the substrate to the pn-junction D16.

Referring to FIG. 8(c), in one embodiment, a light source is positioned proximal to the substrate on the substrate side of the memory cell 850. The light source is operatively configured to emit light of a specific spectrum, having a peak wavelength, indicated with words $\hbar \omega$ (and numbers 851 and 852) and is directed towards the memory cell 850. The spectrum and the peak wavelength of the light source emission are selected to penetrate the substrate an average distance $L_{pen}$ before they get absorbed. Absorption of photons creates electron-hole pairs which are now free to diffuse through the substrate in all directions. A fraction of minority carriers diffuse 853 towards the front of the cell 850 and reach at least the pn-junction D16 between the deep n-well and the p-epilayer. Some carriers also reach pn-junction D12 between the p-epilayer and the n-well, but those carriers are conducted to the VDD terminal (arrow 855) and are not used. The figure does not show other pn-junctions that may or may not capture these diffusing minority carriers as they are not fundamental to the operation of the memory cell refreshing. Once the minority carriers reach a pn-junction, they are swept by the built-in electric field and thereby create a DC current; the pn-junction becomes a current source with current directed from the cathode towards the pn-junction anode. Reaching the pn-junction terminates the diffusion of minority carriers as they become majority carriers on the other side of the junction. The magnitude of the generated current equals the current of minority carriers reaching the pn-junction from one side.

The current generated at pn-junction D16 by the arrival of diffusing minority carriers is the current that is used to discharge storage node Q to assist maintaining a logical zero when the ground is gated. FIG. 8(c) shows only one half of a 6T SRAM cell; the disclosed discharging principle is repeated on the other half of the cell. Since the deep n-well is to be connected to the storage node, there have to be two deep n-wells to realize this embodiment.

Light Sources and Packaging Embodiments

The light source providing illumination to the back or front of the SRAM memory disclosed in the above embodiment may be one of the following: In one embodiment, the light is provided from the ambient. In another embodiment, the light source is a mobile device keyboard backlight or display. In yet another embodiment, the light source is a light-emitting diode (LED) Infrared LEDs may be used around the silicon material bandgap to facilitate deep propagation: few hundreds of micrometers. Light may be absorbed in the substrate within diffusion distance of the pn-junctions described in the above embodiments. FIG. 10 shows light penetration in silicon for different wavelengths. For each of these light sources, the intensity and the depth of penetration are considered in the design for optimal refreshing of the SRAM memory cell.

Figure 14:
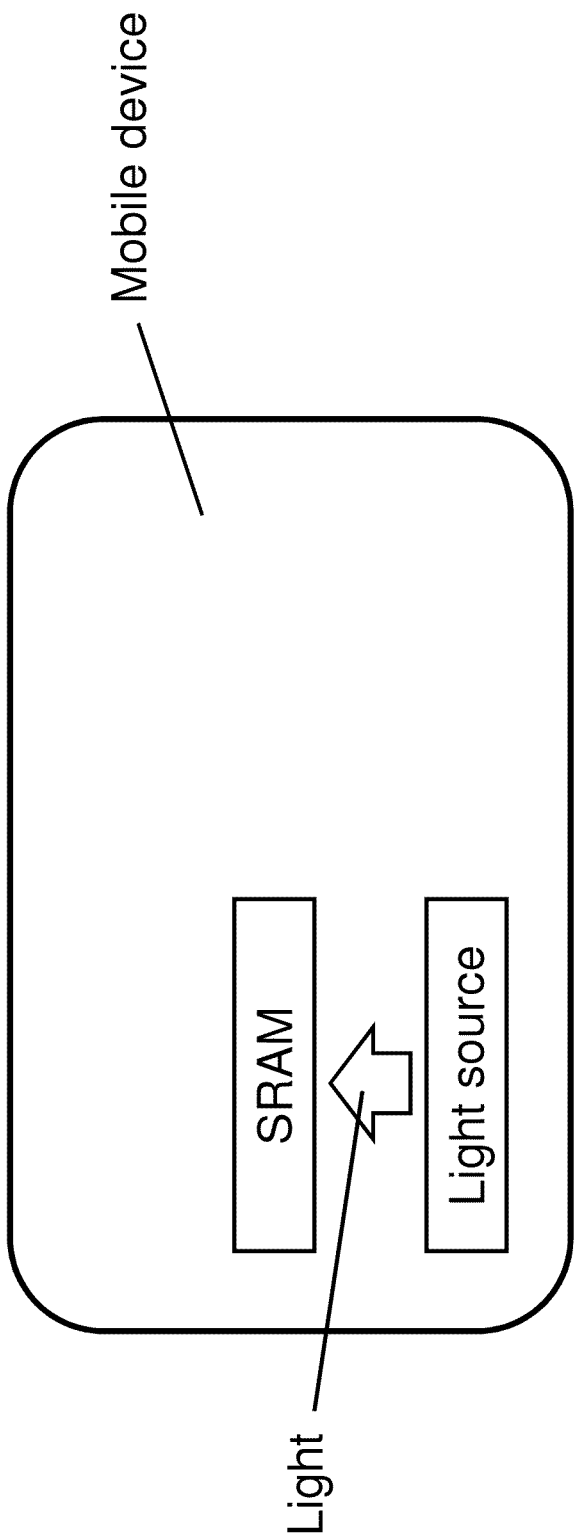
FIG. 14: Schematic illustration of one embodiment of present invention where an SRAM chip and a light-source are included in a mobile device.

For illustration, FIGS. 3(a), 4(b), 5(a), 6(a), 7(b), 8(b), and 8(c) show two exemplary photon sources (indicated with $\hbar \omega$). Although two are drawn they come from a single light source. In one embodiment, a mobile electronic device, shown in FIG. 14, comprises of at least one SRAM memory chip and a source of light, wherein light from the light source is directed towards the SRAM chip and is used to refresh the SRAM chip according to the previously presented embodiments.

In one embodiment, the light source is provided from a light source that already exists in the electronic circuit (mobile phone, tablet, etc.) and hence it does not increase the overall power dissipation. In yet another embodiment, the illumination is provided under pulsed operation in order to reduce the power dissipation by a light-emitting diode or any other special light source that may be used to provide the illumination. Keyboard and display backlight of handheld devices have low efficiency and lot of optical energy is wasted. In one embodiment, the light is brought to the memory chip using lightguides. By using lightguides, the light needed for SRAM chip refreshing is brought from the mobile device's keyboard or display.

Figure 13:
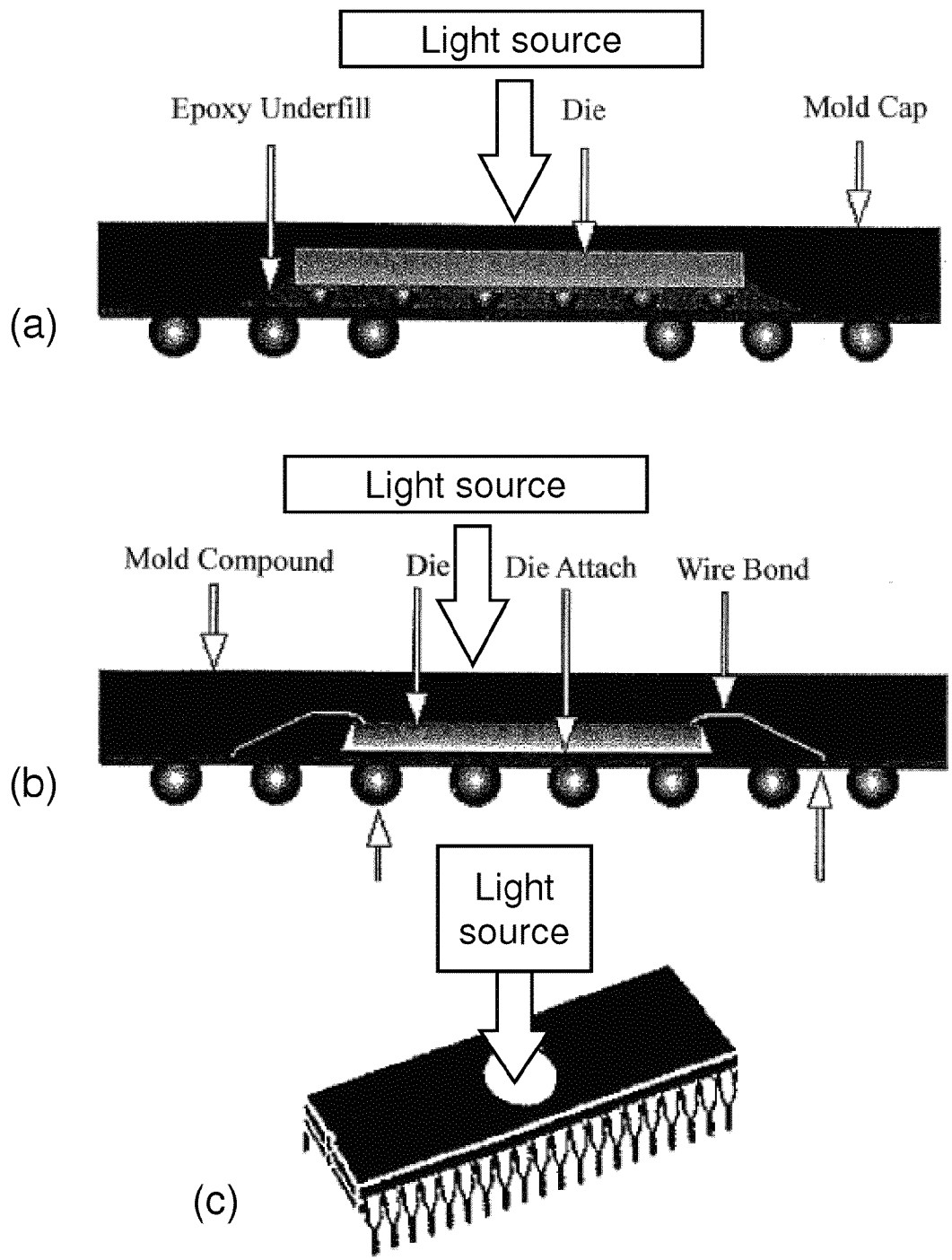
FIG. 13: Packaging embodiments: (a) The SRAM chip is flip-chip mounted into a package and the light source is disposed in proximity of the package so that the emitted light can be absorbed when it is incident on the chip from the substrate side. (b) The SRAM chip is mounted substrate-down into a package and the light source is disposed in proximity of the package so that the emitted light can be absorbed when it is incident on the chip from the front side. (c) An example of a packaged SRAM chip with a window on the front that is transparent to light which is emitted by a light source in the its proximity

In one embodiment, the SRAM chip is flip-chip mounted and the light-source is positioned above the chip illuminating the back of the SRAM chip die as illustrated with FIG. 13(a). In another embodiment, the die of the flip-chip SRAM chip is thinned to less than 300 um so ambient light (in the visible spectrum) can be used for optical refreshing. Due to high resistivity of silicon substrate, diffusion length of optically generated charge carriers is over 300 um. Front illumination for wire bond packing chip is illustrated with FIGS. 13(b) and 13(c). Enhancing of optical throughput can also be achieved by introduction of nanoholes in upper metal layers of multi metal SOC (System On Chip) chips. Prior to metal patterning metal is treated by technology enabling uniform and mask less nanoholes production. After patterning of metal lines they are perforated with nanoholes for improved optical transmission due to effect of surface plasmons in metal layers. T. W. Ebbesen, H. J. Lezec, H. F. Ghaemi, T. Thio, and P. A. Wolff, "Extraordinary optical transmission through sub-wavelength hole arrays" Nature, 391 (6668): 667-669, 1998. In standard wire bond packing, front side refreshing is self-enhanced due to effect of sub wavelength nanoslits—SRAM metal power lines and bitlines, particularly at below 100 nm technologies. Namely for 100 nm technology metal lines' distances are app. 200 nm which is more than three times less than red light wavelength (650 nm).

Experimental Data

Figure 16:
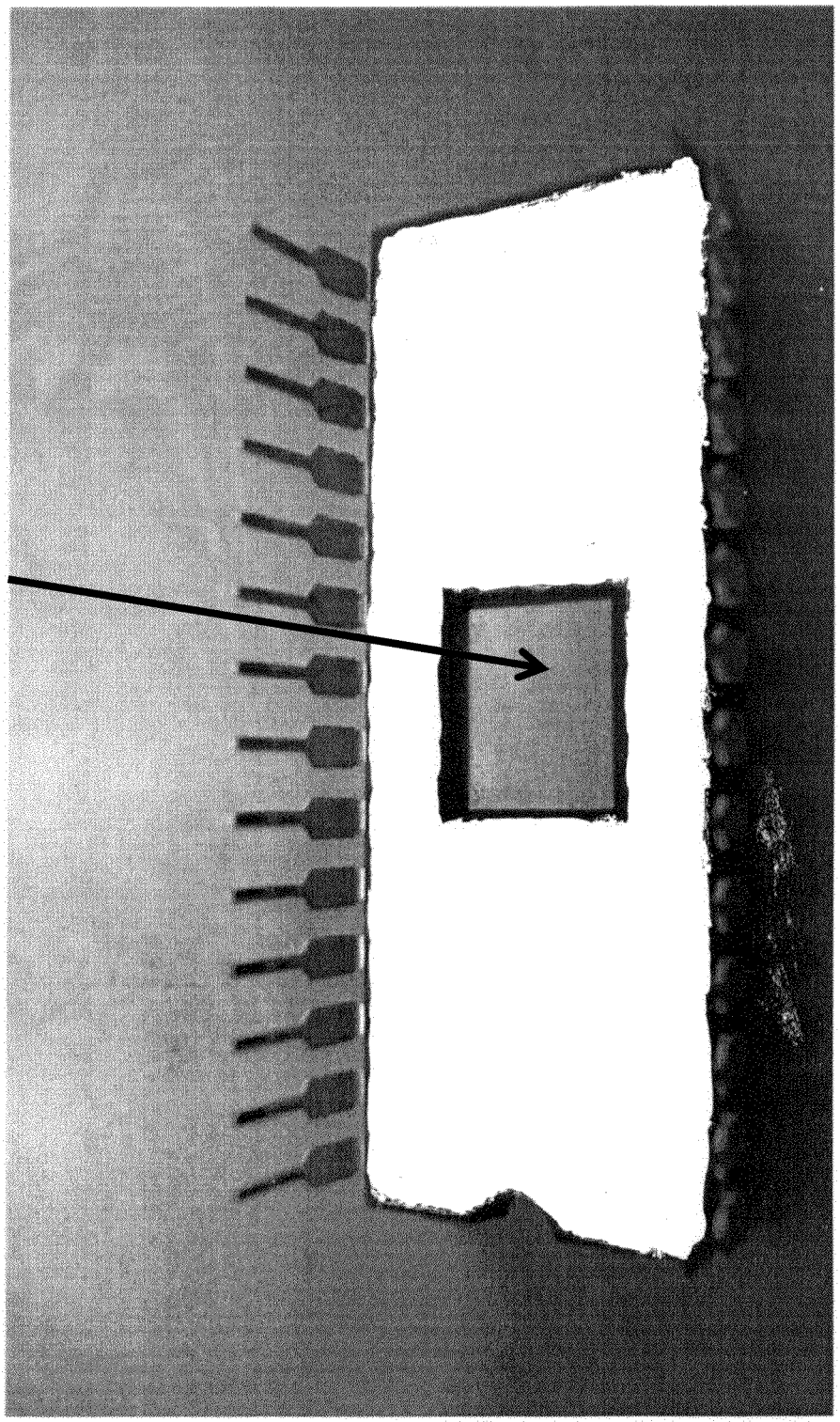
FIG. 16: Photograph of a 64 k SRAM memory chip with the silicon substrate revealed that was analyzed for this application.
Figure 17:
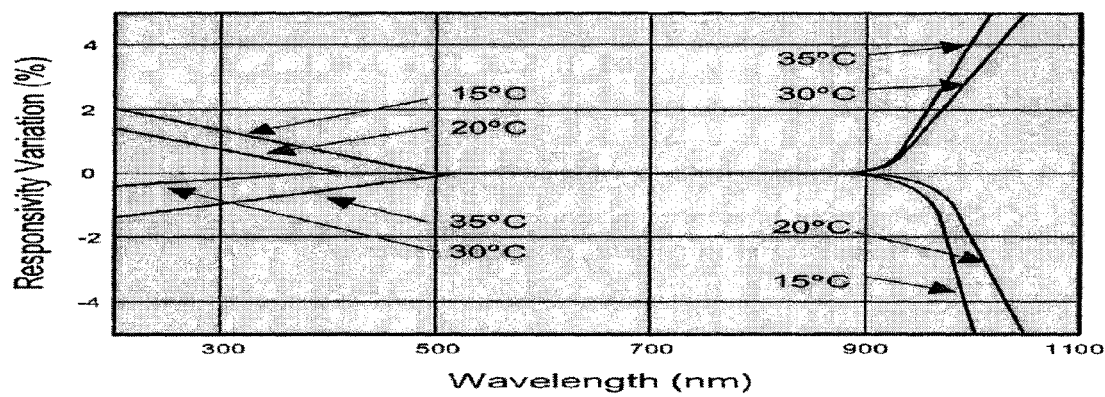
FIG. 17: Silicon pn-junction responsivity and its temperature coefficient versus wavelength.

Measurements have been performed to show the total current draw in a refreshed memory. A 64 kB SRAM chip (NEC UPD 4464) was opened from the front side and illuminated using light-emitting diodes of different wavelengths to demonstrate that total charge generation does have a magnitude that can match the total leakage. FIG. 16 shows a photograph of the memory chip package opened to reveal the back of the silicon die, while the chip was biased, but nominally in standby mode. The silicon die was not thinned or polished.

Figure 15:
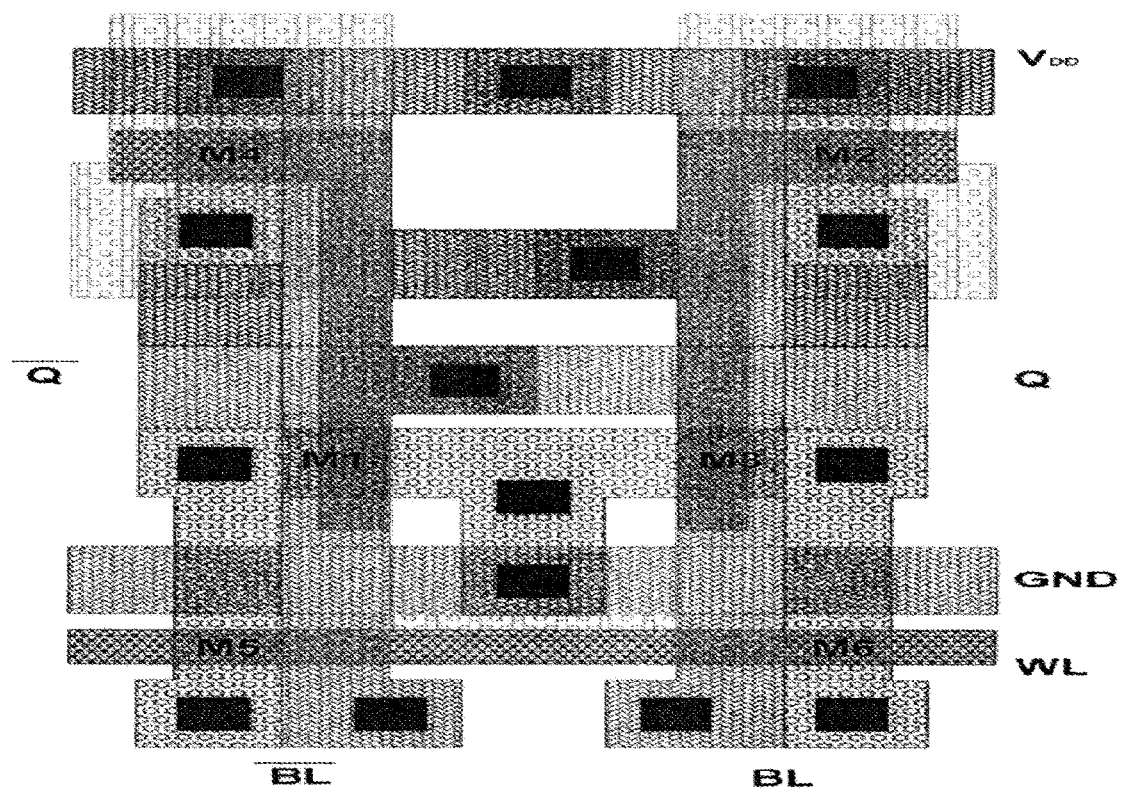
FIG. 15: Exemplary top view of a 6T SRAM cell.

The memory chip was biased and total current was measured with and without illumination. Two experiments were performed: Font illumination and back illumination. These are equivalent to the disclosure shown in FIGS. 5(a) and 3(a), respectively. Illumination for the front was provided using light-emitting diodes in the visible range (650 nm) and for the back using a near-infrared (980 nm) light-emitting diode. The light intensity emitted by the light-emitting diodes and reaching the surface of the silicon die was estimated to be 25 mW. In both cases, the standby current drawn by the memory chip increased by 1 mA. From this measurement one can estimate the effective amount of optically generated current in the chip that is available for cell refreshing: The useful charge collecting area in 6T SRAM cell is approx. 10% of cell's area as can be estimated from FIG. 15 which illustrates the cell layout. A 64 kB memory has 65,536 cells and this means that approximately 1.5 nA is available for refreshing each cell, which is more than sufficient for refreshing. According to its datasheet, the total chip leakage at room temperature is 200 nA. Therefore, the 64 kB memory chip tested in the above-described experiment could be refreshed with 500Times lower light intensity incident on the chip. Namely, a light source with as little as 50 µW incident on the chip would be sufficient. However, reducing the silicon chip thickness will increase the collection efficiency. Furthermore, the conversion efficiency is increased by employing the embodiment 2B where the collection area for monitory carriers is dramatically increased by adding a separate deep well. For example if the chip tested would use gated GND leakage reduction only 500 nW optical power would be sufficient for data retention.

Cell Outline.

As described herein optical refreshing is effected by generation of photocurrents in parasitic photodiodes of PMOS transistors, P+ drain/source-N substrate/N well. Considering six transistors per cell and two anodes (drain and source) per transistor, useful charge collecting area is only approximately 8.5% of the memory cell area as shown in the 6T SRAM cell layout example in FIG. 15. FIGS. 4B and 8C show increase of this area to more than 20% by introducing deep P well in P-well (N substrate CMOS technology) or deep N well if p-substrate is used. With deep wells for increased charge collecting area, the total charge collecting area can reach 50% of the cell area in loadless 4T SRAMs also used as cache SRAMs in some microprocessors and System on Chip.

Aforementioned invention is described in a way that it may enable anyone skilled in the art to make similar optical refreshing solutions within silicon CMOS technology. It is possible to use the same invention in System on Chip and Application Specific Integrated Circuits SRAM memories. Furthermore, it is clear that innovative concepts disclosed one embodiment can be combined with another embodiment depending on the application and semiconductor processing requirements without departing from the spirit of the invention.

The invention claimed is:

1. A memory cell having a front side and a back side, said memory cell comprising:
   a semiconductor substrate;
   a PMOS transistor disposed on said front side;
   a P well disposed on said front side, said P well forming at least one P well-to-substrate PN-junction;
   an NMOS transistor located in said P well;
   a ground terminal disposed on said front side and electrically connected to said P well; and
   a power supply terminal disposed on said front side and electrically connected to the source of said PMOS transistor, said power supply terminal having a voltage equal to a margin-free constant data retention voltage (DRV);
   wherein said memory cell is optically refreshed by a refreshing photocurrent in response to light generated by a light source;
   wherein said at least one P well-to-substrate PN-junction generates a parasitic photocurrent that flows into said at least one ground terminal and
   wherein said PMOS transistor is located in an N well located in a deep P well, said deep P well forming a PN-junction with said substrate such that said deep P well-to-substrate PN junction generates said memory cell refreshing photocurrent in response to light generated by said light source.

2. The memory cell of claim 1 wherein said deep P well is electrically connected to the drain of said PMOS transistor.

* * * * *